(12) United States Patent
Nakamura et al.

(10) Patent No.: US 7,059,607 B2
(45) Date of Patent: Jun. 13, 2006

(54) POSITIONING APPARATUS

(75) Inventors: Tsuyoshi Nakamura, Kanagawa (JP); Nobuhito Saji, Kanagawa (JP)

(73) Assignee: NSK Ltd., Tokyo (JP)

( * ) Notice: Subject to any disclaimer, the term of this patent is extended or adjusted under 35 U.S.C. 154(b) by 41 days.

(21) Appl. No.: 10/202,607

(22) Filed: Jul. 25, 2002

(65) Prior Publication Data
US 2003/0030224 A1  Feb. 13, 2003

(30) Foreign Application Priority Data
Jul. 25, 2001 (JP) ............................. 2001-223791
Dec. 19, 2001 (JP) ............................. 2001-385415

(51) Int. Cl.
*F16L 15/40* (2006.01)
(52) U.S. Cl. .................. 277/432; 384/12; 277/628
(58) Field of Classification Search ................. 384/12; 277/628, 432
See application file for complete search history.

(56) References Cited
U.S. PATENT DOCUMENTS
4,191,385 A * 3/1980 Fox et al. .................. 277/432

| 4,560,880 | A  | * | 12/1985 | Petric et al. ........... 250/441.11 |
| 4,726,689 | A  | * | 2/1988  | Pollock ...................... 384/12 |
| 6,163,033 | A  | * | 12/2000 | Smick et al. .......... 250/441.11 |
| 6,172,372 | B1 | * | 1/2001  | Vanderpot .............. 250/492.21 |
| 6,437,351 | B1 | * | 8/2002  | Smick et al. .......... 250/492.21 |
| 6,445,440 | B1 | * | 9/2002  | Bisschops et al. ........... 355/53 |

* cited by examiner

*Primary Examiner*—Vishal Patel
(74) *Attorney, Agent, or Firm*—Sughrue Mion, PLLC

(57) ABSTRACT

In the present positioning apparatus, a positioning apparatus, comprising: a box body including a process chamber exposed to a decompression environment in the interior of the box body and an opening allowing said process chamber to communicate with an outside; a moving member for shielding said opening of said box body with a slight clearance between said box body and the moving member and movable with respect to said opening of said box body; and a differential pumping seal for sealing said slight clearance between said opening of said box body and said moving member, wherein a portion of said moving member to be moved into the interior of said process chamber, when said moving member moves, is formed as an adsorption preventive area.

9 Claims, 16 Drawing Sheets

POSITIONING APPARATUS

BACKGROUND OF THE INVENTION

The present invention relates to a positioning apparatus which can move a work, for example, in a chamber insulated from the external environment.

In a semiconductor manufacturing apparatus, when working a work, the work is moved while it is placed on a stage within a process chamber maintained at a vacuum atmosphere or at a specific gas atmosphere. Here, in case where a positioning apparatus including a drive source is disposed within the process chamber; because the interior of the process chamber can be kept sealed with respect to the exterior of the process chamber, the vacuum atmosphere or specific gas atmosphere can be maintained relatively easily.

However, in case where the positioning apparatus including a drive source is disposed within the process chamber, the process chamber itself increases in size. This takes a lot of time to make the interior of the process chamber reach a given level of pressure, requires a large quantity of specific gas for filling the interior of the process chamber, or makes it difficult to maintain the positioning apparatus.

On the other hand, in case where the capacity of the process chamber is minimized, the above-mentioned problems can be truly solved but there is required a structure in which the table for placing the work thereon can be driven from the outside of the process chamber. As a structure of this type, there is known a structure in which there is disposed a moving shaft extending between the interior and exterior of the process chamber through an opening formed in the wall of a box body in communication with the process chamber, and the moving shaft is moved with respect to the box body to thereby drive the table existing in the interior of the process chamber from the exterior of the process chamber. And, there is also known another structure in which there is disposed a flat plate for shielding the surface of the opening of the box body, and the flat plate is moved with respect to the box body to thereby drive a table existing in the interior of the process chamber and placed on the flat plate from the exterior of the process chamber. In either of these structures, a clearance between the box body and moving shaft or flat plate is sealed by a differential pumping seal to thereby be able to maintain the environment of the interior of the process chamber (for example, see U.S. Pat. No. 4,191,385).

By the way, referring to the base material of the above-mentioned moving shaft or flat plate serving as a moving member, for example, for a vacuum atmosphere, in some cases, there is used metal material such as stainless steel or aluminum alloy (which has received surface treatment such as washing in order to reduce the gas release speed) which is excellent in vacuum characteristic. Also, for example, in case where the interior of the process chamber is held at a negative pressure, the moving shaft or flat plate is caused to receive a great force due to a difference in pressure between the interior and exterior of the process chamber; and, in case where the moving shaft or flat plate is flexed or deformed, there is a fear that the positioning accuracy of the work can be lowered. To avoid this, there is proposed an attempt to use ceramic material light in weight (low in specific gravity) and high in rigidity as the base material of the moving shaft or flat plate. Since the ceramic material is non-magnetic material, especially when an ion charge apparatus or an electronic beam apparatus requiring a vacuum environment and a low magnetic field variation is used to work a work existing in the interior of the process chamber, it can be said that the ceramic material is suitable for the moving shaft or flat plate.

However, because the normal ceramic material is sintered micro-particles (powder), due to occlusion of gas molecules (adsorption of gas molecules within a capillary tube), when compared with metal material, a large quantity of gas is released. Further, when compared with metal material, it is difficult to enhance the surface roughness of the ceramic material (in the case of the normal ceramic material, the limit is Ra=approx. 100 nm) and the actual area (adsorption area) of the ceramic material is larger than that of the metal material in case where they are equal in surface area to each other; and, as a result of this, a large quantity of gas is released. Therefore, in case where the surface of the ceramic material, which has adsorbed the molecules of the air, advances into the interior of the process chamber together with the movement of the moving shaft or flat plate, the accumulated air molecules are eliminated from the ceramic surface, which raises a fear that the pressure in the interior of the process chamber can be raised or the density of the specific atmosphere gas can be varied. Also, in case where, instead of the ceramic material, metal such as stainless steel is used as the blank material of the moving shaft and flat plate, it is true that the surface roughness of the metal is better (that is, the surface area is smaller) than the ceramic material, but, in the case of metal atoms as well, there occurs such phenomenon as in the ceramic material, that is, adsorption of the molecules of the air; and, therefore, there is a possibility that there can be raised a similar problem.

However, even in case where there is used the metal material that, as described above, is excellent in vacuum characteristic, in the portion of the moving member that is exposed to the air, adsorption of gas molecules to the surface of the exposed portion cannot be avoided. Normally, in a vacuum apparatus, there can be obtained a good vacuum condition through the following exhaust process, comprising: a step (1) of releasing the air from the interior of the vacuum apparatus; a step (2) of releasing gas molecules adsorbed to the inner wall of the vacuum apparatus; a step (3) of diffusing hydrogen gas from the composing members of the vacuum apparatus; and, a step (4) of allowing the air to permeate into the interior of the vacuum apparatus from the atmospheric environment.

However, in the conventional apparatus to which the differential pumping seal is applied, the surface of the exposable portion of the moving member, from which the adsorbed gas molecules have been released in a vacuum environment, is allowed to move from the process chamber through the seal portion thereof to the atmospheric environment. Therefore, since the surface of the exposable portion with the adsorbed gas molecules reduced in the vacuum environment, is exposed to the atmospheric environment, the adsorbed gas molecules are returned to their initial states. And, incase where the exposable portion returns into the process chamber, the adsorbed gas molecules of the exposable portion are gradually released in the interior of the process chamber; and, this operation cycle is repeated. The repetition of this operation cycle deteriorates the degree of vacuum in the interior of the process chamber.

While the foregoing description has been given on the assumption that the process chamber is held at a vacuum atmosphere, the phenomenon occurring on this assumption can be similarly found also in an apparatus in which a differential pumping seal is used in a high-density specific atmospheric gas process chamber. That is, there is a fear that gas molecules existing in the exterior of the process chamber can move into the interior of the process chamber along with the movement of a moving shaft or a flat plate to thereby vary the density of the gas existing in the interior of the process chamber.

Here, in the above-mentioned conventional positioning apparatus, there are found the following problems. Firstly, when the moving member is moved into and out of the process chamber kept in the vacuum environment, the gas particles adsorbed to the surface of the moving member in the exterior of the process chamber are released into the vacuum environment of the interior of the process chamber to thereby change the degree of vacuum in the interior of the process chamber. As a measure to avoid this problem, it can be expected to reduce the area of the surface of the moving member which is moved into and out of the process chamber. Here, generally, the surface of the moving member is worked with a certain degree of accuracy in view of the fact that it is guided by a guide member. However, to work the surface of the moving member with a higher degree of accuracy in order to reduce the surface area increases the cost of the moving member greatly. Therefore, this measure is not desirable. On the other hand, as a measure to cope with the change in the degree of vacuum, it can be expected to cover the surface of the moving member movable into and out of the process chamber with inert gas. In this case, however, it is necessary to dispose a storage tank for storing the inert gas therein, which unfavorably increases the cost of the positioning apparatus. Also, it is normally necessary to dispose a facility for collecting the inert gas and a facility for detecting the leakage of the inert gas.

SUMMARY OF THE INVENTION

The present invention aims at eliminating the drawbacks found in the above-mentioned conventional positioning apparatus. Accordingly, it is an object of the present invention to provide a positioning apparatus which can effectively prevent gas molecules existing in the exterior of the process chamber from moving into the interior of the process chamber.

In attaining the object, according to a first aspect of the present invention, there is provided a positioning apparatus, comprising a box body including a process chamber exposed to a decompression environment in the interior of the box body and an opening allowing said process chamber to communicate with an outside; a moving member for shielding said opening of said box body with a slight clearance between said box body and the moving member and movable with respect to said opening of said box body; and a differential pumping seal for sealing said slight clearance between said opening of said box body and said moving member, wherein a portion of said moving member to be moved into the interior of said process chamber, when said moving member moves, is formed as an adsorption preventive area.

In case where the present portion of the moving member is exposed to the interior of the process chamber with gas molecules adsorbed to or occluded to the surface of the present portion, the thus adsorbed or occluded gas molecules are eliminated in the interior of the process chamber, which results in the lowered degree of vacuum in the interior of the process chamber.

In view of this, according to the present invention, at least the portion of the moving member to be moved into the interior of the process chamber is formed as an adsorption preventive area through some means, whereby the excellent degree of vacuum in the interior of the process chamber can be maintained.

In addition, in the case of an "absorption" is not especially explained in the claims or the specification, the "absorption" means not only absorption onto a surface of the moving member but also occlusion into the moving member.

Also, according a second aspect of the present invention, There is provided a positioning apparatus as set forth in the first aspect of the present invention, wherein a width of a portion of said box body opposed to said moving body in a moving direction of said moving member is set equal to or larger than a moving amount of said moving member.

In this case, since the portion of the moving member to be moved into the interior of the process chamber is always opposed to the box body or to the process chamber and is thereby always held at the negative pressure, gas molecules are hard to be adsorbed to or occluded to the surface of the present portion.

Here, a portion of the moving member, which is opposed to the box body (including a differential pumping seal) and is to be moved into the interior of the process chamber, corresponds to the adsorption preventive area. Due to the suction by the differential pumping seal, the adsorption or occlusion of the gas molecules to the surface of the present portion is difficult to occur.

As described above, a positioning apparatus according to the present invention comprises: a box body including a process chamber formed in the interior thereof and an opening for allowing the process chamber to communicate with the outside; a moving member for shielding at least part of the opening of the box body and movable with respect to the opening of the box body; and, a differential pumping seal for sealing a clearance between the box body and moving member, wherein, in order to prevent the portion of the moving member exposed to the outside of the box body due to the movement of the moving member from being moved into the interior of the process chamber, the width of the portion of the box body opposed to the moving body in the moving direction of the moving member is set equal to or larger than the moving amount of the moving member. Thanks to this, even in case where gas molecules are adsorbed to the surface of the portion of the moving member exposed to the exterior of the process chamber, the present surface is prevented from moving into the interior of the process chamber, thereby being able to protect the environment of the interior of the process chamber.

Also, according to a third aspect of the present invention, there is provided a positioning apparatus as set forth in the second aspect of the present invention, wherein a seal surface of said differential pumping seal on said box body side includes a plurality of groove portions so formed as to surround said opening, and said plurality of groove portions are respectively formed so as to communicate with their associated exhaust passages, and also wherein the width of the near-to-process-chamber end of one of said groove portions being most distant from said process chamber to said process chamber in the moving direction of said moving member is set equal to or larger than the moving amount of said moving member.

In this case, even when higher sealing performance is required, elimination of the gas molecules into the process chamber can be restricted more effectively. The sealing performance of the positioning apparatus can be enhanced further. Due to this, even when further higher sealing performance is required, there can be obtained high sealing performance with more certainty.

Moreover, according to a fourth aspect of the present invention, there is provided a positioning apparatus as set forth in any one of the second aspect or the third aspect of the present invention, wherein a hydrostatic bearing using inert gas as a medium is disposed in combination with said differential pumping seal so as to adjoin the side of said differential pumping seal situated near to an outside.

A hydrostatic bearing using inert gas as a medium may be disposed in combination with the differential pumping seal in such a manner that it adjoins the side of the differential pumping seal situated near to the outside. Thanks to this, as the hydrostatic bearing and differential pumping seal can be combined together as a unit, even in case where the moving member has a relatively large stroke, high sealing performance can be obtained.

In attaining the object, according to a fifth aspect of the present invention, there is provided a positioning apparatus as set forth in the first aspect of the present invention, further including: a cover member for covering at least the portion of said moving member movable between an interior side and an exterior side of said process chamber on said process chamber exterior side; and an air supply device for supplying a dry air having lower humidity than the atmosphere of said process chamber exterior side into said cover member.

A portion of the moving member, which is covered with the cover member and is to be moved into the interior of the process chamber, corresponds to the adsorption preventive area.

From researches made by the inventors, it has been found that, of the gas molecules adsorbed to the moving member and movable from the exterior of the process chamber into the interior thereof, the moisture occupies a high percentage. That is, in case where, as the environment to which the portion of the moving member movable into and out of the process chamber is exposed, there is used an environment filled with the dry air (that is, the air with the moisture component removed therefrom), the amount of gas to be released into the interior of the process chamber can be restricted as effectively as in an environment filled with inert gas. Since the dry air can be obtained by removing the moisture from the air, when compared with creation of the inert gas environment, formation of the dry air environment makes it possible to reduce the time and labor for management and cost thereof effectively.

By the way, when the environment of the process chamber exterior side contains the air having the humidity of 50%, preferably, the dry air may be the air having such humidity that can control variations in the pressure of the interior of the process chamber caused by the movement of the moving member down to 30% or less. In this case, the amount of gas to be released into the interior of the process chamber can be restricted more effectively.

Also, more preferably, the dry air may be the air having the humidity of 10% or less (that is, the air having such humidity that allows a dew-point temperature with respect to the atmospheric pressure in the environment of the exterior side of the process chamber to be −15° C. or less in the exit portion of the air supply device). In this case, the amount of gas to be released into the interior of the process chamber can be restricted further more effectively.

Further, in case where the cover member consists of a hydrostatic bearing for guiding the moving member, the number of parts can be reduced and also the positioning apparatus can be made compact in structure.

Here, the term "differential pumping seal" means a member having the following function: that is, by exhausting a gas existing, for example, in a slight clearance between two mutually opposing surfaces, the environments on the two sides with the opposed surfaces between them (for example, an atmospheric environment and a high-vacuum environment) can be kept in a constant state in a non-contact manner. Therefore, the term "slight clearance" between the box body and moving member according to the present invention means a clearance of a level that allows the differential pumping seal to perform its seal effect effectively.

According to a ninth aspect of the present invention, there is provided a positioning apparatus as set forth in the first, second and fifth aspect of the present invention wherein said adsorption preventive area is formed such that at least the surface thereof is formed of high-density material or is coated with a CVD film or a PVD film.

In attaining the above object, there may be provided a positioning apparatus, comprising: a box body including not only a process chamber formed in the interior thereof so as to be exposed to a decompressed environment but also an opening for allowing the process chamber to communicate with the outside; a moving member formed of ceramic material for shielding at least part of the opening of the box body and movable with respect to the opening of the box body; and, a differential pumping seal for sealing the opening of the box body and moving member with respect to each other, wherein close-density material is disposed on the surface of at least the portion of the moving member movable between the interior and exterior of the process chamber.

Also, there may be provided a positioning apparatus, comprising: a box body including not only a process chamber formed in the interior thereof so as to be exposed to a decompressed environment but also an opening for allowing said process chamber to communicate with the outside; a moving member formed of ceramic material for shielding at least part of the opening of the box body and movable with respect to the opening of the box body; and, a differential pumping seal for sealing the opening of said box body and moving member with respect to each other, wherein a coating is disposed on the surface of at least the portion of the moving member movable between the interior and exterior of the process chamber.

Further, there may be provided a positioning apparatus, comprising: a box body including not only a process chamber formed in the interior thereof so as to be exposed to a decompressed environment but also an opening for allowing the process chamber to communicate with the outside; a moving member formed of metal material for shielding at least part of the opening of the box body and movable with respect to the opening of the box body; and, a differential pumping seal for sealing the opening of the box body and moving member with respect to each other, wherein a coating formed of non-metal material is disposed on the surface of at least the portion of said moving member movable between the interior and exterior of the process chamber.

As described above, a positioning apparatus according to the present invention comprises a box body including not only a process chamber formed in the interior thereof so as to be exposed to a decompressed environment but also an opening for allowing the process chamber to communicate with the outside, a moving member formed of ceramic material such that it can shield at least part of the opening of the box body and it is able to move with respect to the opening of the box body, and a differential pumping seal for sealing the opening of the box body and moving member with respect to each other, while close-density material is disposed on the surface of the portion of the moving member movable between the interior and exterior of the process chamber. Thanks to this, in case where, as the base material of the moving member, there is used ceramic material which is light in weight (low in specific gravity) and high in rigidity, the deformation of the moving member can be reduced to thereby be able to enhance the positioning accuracy. Also, since ceramic material is non-magnetic material, especially when an ion charge apparatus or an electronic beam apparatus requiring a vacuum environment and low magnetic field variations is used in working a work in the interior of the process chamber, there can be provided a more suitable positioning apparatus. In addition to this, because the close-density material is disposed on the surface of at least the portion of the moving member movable between the interior and exterior of the process chamber, the adsorption of the gas molecules can be restricted to thereby be able to protect the environment of the interior of the process chamber.

As an example of the close-density material of ceramic material, there is available high-density ceramic in which the number of pores is reduced. Some of high-density ceramic can provide a good surface having surface roughness Ra of 100 nm or less. Especially, data on the "pore-free" (which is a trade mark registered by Nippon Ceratec Co. Ltd.) manufacture by Nippon Ceratec Co. Ltd. show that the "pore-free" material is superior to 99.9% alumina in the moisture elimination characteristic. The "pore-free" material can form a high-accuracy surface having surface roughness Ra of 10 nm or less. Of course, after the high-density ceramic material is worked, it must be washed sufficiently. Unless it is washed sufficiently, the polished dregs remain in the pores, which gives rise to the pollution of the interior of the process chamber.

Also, a positioning apparatus of the present invention comprises a box body including not only a process chamber formed in the interior thereof so as to be exposed to a decompressed environment but also an opening for allowing the process chamber to communicate with the outside, a moving member formed of ceramic material such that it can shield at least part of the opening of the box body and it is able to move with respect to the opening of the box body, and a differential pumping seal for sealing the opening of the box body and moving member with respect to each other, while a close-density coating is disposed on the surface of at least the portion of the moving member that is allowed to move between the interior and exterior of the process chamber. In case where, as the mother material of the moving member, there is used ceramic material which is light in weight (low in specific gravity) and is high in rigidity, the deformation amount of the moving member can be restricted to thereby be able to enhance the positioning accuracy thereof. Also, since the ceramic material is non-magnetic material, especially when an ion charge apparatus or an electronic beam apparatus requiring a vacuum environment and low magnetic field variations is used in working a work in the interior of the process chamber, there can be provided a further suitable positioning apparatus. In addition to this, because the coating is disposed on the surface of at least the portion of the moving member that is allowed to move between the interior and exterior of the process chamber, the adsorption and elimination of the gas molecules can be restricted to thereby be able to protect the environment of the interior of the process chamber.

In the current technical level, in the case of the close-density material, especially, in the case of the large-sized close-density material, it is relatively difficult to provide a high-accuracy surface having surface roughness Ra of 100 nm or less. On the other hand, by applying the coating onto the necessary portion of ceramic, in the case of the large-sized close-density material, the small pores thereof, to which gas molecules can be easily adsorbed, can be closed at a relatively low cost, which makes it possible to reduce the substantial surface area of the close-density material.

As the coating, a CVD film or a PVD film may be formed on the surface of the ceramic material. Specifically, for example, Sic (porous material) is used as the base material and the surface of the base material is coated with the CVD film. As the other mother material, there can be used various kinds of ceramic material such as alumina, silicone nitride and zirconia. On the other hand, as the coating material, there can also be effectively used other films such as PVD films which are formed of TiN and TiC, and a sapphire film. Also, as the coating material, in order to reduce the adsorption force with respect to the gas molecules, there may be preferably used non-metal material. Since the CVD film and PVD film are close-density material, they can have desired effects on the porous ceramic material; that is, they can reduce the actual surface area of the porous ceramic material and thus can restrict the gas molecule occlusion phenomenon. Also, a DLC film (hard carbon film) can also be used. The DLC film can be obtained in both of CVD and PVD. And, even in case where metal material is used as the base material of the moving member, at least the surface of the portion of the moving member, which is allowed to move between the interior and exterior of the process chamber, may also be coated with non-metal material. Since as metal base material, for example, there can be used stainless steel or aluminum alloy, there can be provided a moving member which is low in cost; and, by applying the coating formed of the above-mentioned various kinds of non-metal material onto the surface of the necessary portion of the metal base material, the gas molecules can be prevented from moving into the interior of the process chamber from the surface of the moving member.

Further, in order not only to minimize the adsorption of the gas molecules under the atmospheric pressure but also to promote the elimination of the gas molecules, preferably, inert gas may be used as the atmosphere gas for the atmospheric pressure. Since moisture is most disliked in the atmospheric environment as well, preferably, there may be formed a dry (dehumidified) air atmosphere. Also, in case where an inert gas area of $N_2$ or argon is formed only in the portion which is close to the seal area (for example, it is effective to spray the inert gas like an air curtain), the inert gas can be adsorbed firstly to the surface of the movable portion which is allowed to move from the vacuum area to the atmospheric pressure area, thereby being able to promote the elimination of the adsorbed gas molecules.

Here, the term "differential pumping seal" means a seal which exhausts gas existing in a slight clearance between two mutually opposed surfaces to thereby keep two environments (for example, the atmospheric pressure environment and high vacuum environment) enclosing the two opposed surfaces in a constant state and in a non-contact manner. In the embodiments to be discussed below, a member having an exhaust surface is referred to as a differential pumping seal.

DETAILED DESCRIPTION OF THE PREFFERED EMBODIMENTS

Figure 1:
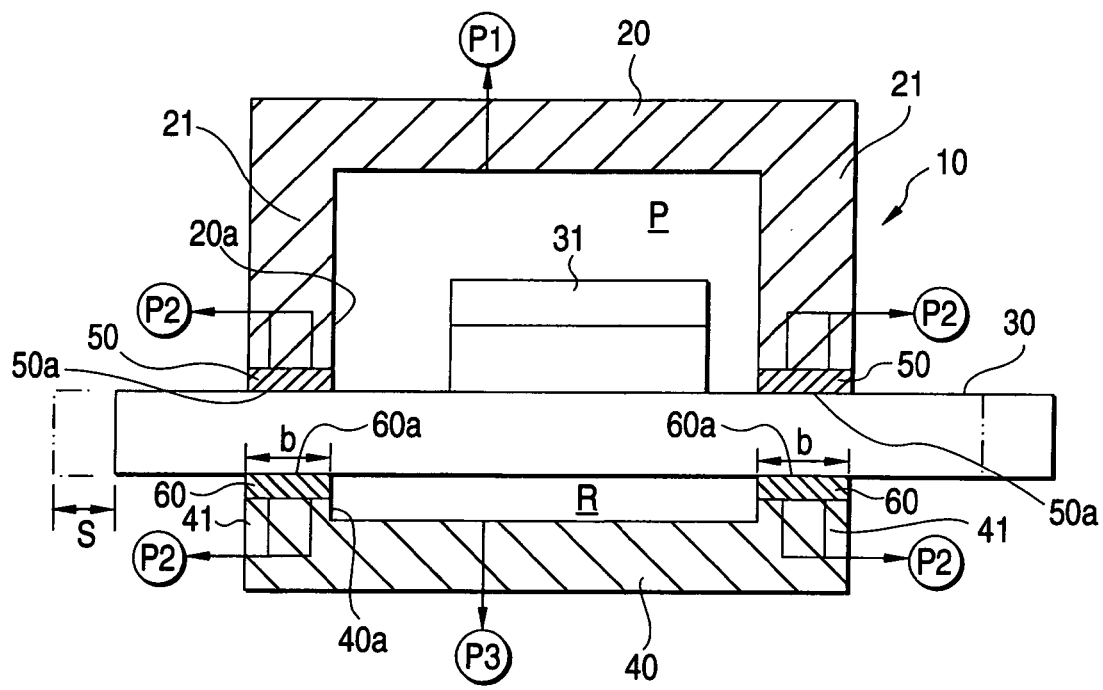
FIG. 1 is a front section view of a positioning apparatus 10 according to a first embodiment of the present invention.

Now, description will be given below of the preferred embodiments of a positioning apparatus according to the present invention with reference to the accompanying drawings. FIG. 1 is a front section view of a positioning apparatus according to a first embodiment of the present invention, in which a differential pumping seal is shown in a simplified manner. As shown in FIG. 1, a positioning apparatus 10 according to the present embodiment comprises a first box body 20 including not only a process chamber P and an opening 20a which allows the process chamber P to communicate with the outside, a moving block 30 disposed so as to shield the opening 20a of the first box body 20, and a second box body 40 disposed so as to be opposed to the first box body 20 with the moving block 30 between them. The process chamber P is sucked by a pump P1 through a pipe (which is shown in a simplified manner) and is thereby held in a negative pressure environment. A decompression chamber R, which is formed in the interior of the second box body 40, is sucked by a pump P3 through a pipe (which is shown in a simplified manner) and thus it is similarly held in a negative pressure environment. By the way, the openings 20a and 40a are the same in shape and are disposed so as to be opposed to each other.

The moving block 30, with the two ends thereof supported by bearings (not shown), can be moved in the right and left direction in FIG. 1 by a drive part (not shown) (for example, a combination of a motor and a ball screw, or a linear motor) and carries on the central portion thereof a table 31 for supporting a work (not shown). On the surfaces of the periphery of the opening 20a of the first box body 20 that are opposed to the moving block 30, there are disposed first differential pumping seals 50 with a given clearance between them. On the other hand, on the surfaces of the second box body 40 that are opposed to the moving block 30, there are disposed second differential pumping seals 60 with a given clearance between them. The first differential pumping seal 50 and second differential pumping seal 60 are respectively sucked by pumps P2 through their associated pipes (which are shown in a simplified manner) to thereby seal the process chamber P and decompression chamber R with respect to the outside. By the way, according to the present embodiment, the bearing surface (not shown) opposed to the upper surface of the moving block 30 constitutes a first guide surface, while the bearing surface (not shown) opposed to the lower surface of the moving block 30 constitutes a second guide surface.

Figure 2:
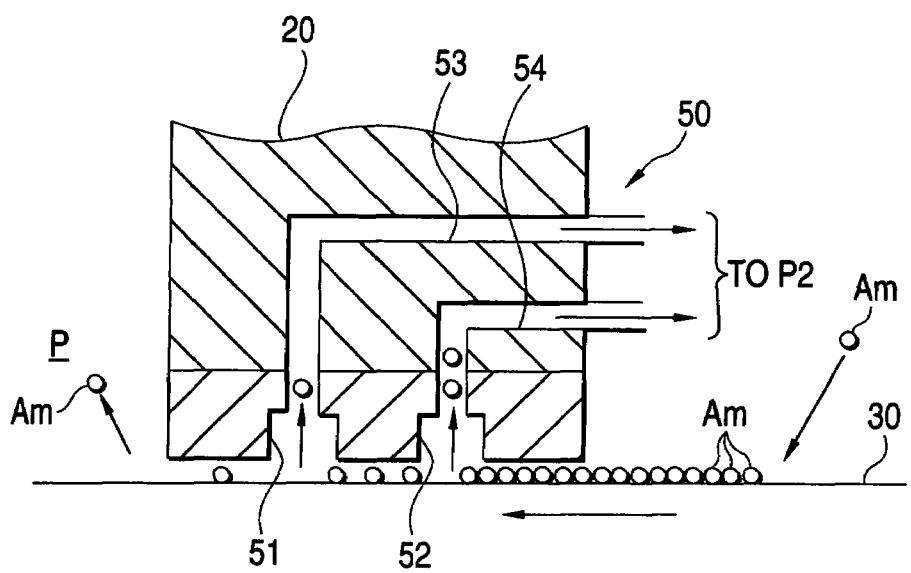
FIG. 2 is an enlarged section view of the periphery of a differential pumping seal 50, showing the absorption or occlusion and elimination of gas molecules in a typified manner.

Now, FIG. 2 is an enlarged section view of the periphery of the first differential pumping seal 50, showing the adsorption and elimination of gas molecules in a typified manner. The first differential pumping seal 50 is formed so as to enclose the opening 20a. Specifically, the lower surfaces of the side walls 21 of the first box body 20, which are disposed opposed to the surface of the moving block 30, provide seal surfaces 50a respectively including groove portions 51, 52 formed so as to extend along the opening 20a; and, the first differential pumping seal 50 further includes exhaust passages 53, 54 respectively communicating from the groove portions 51, 52 to the pumps P2 which are disposed externally of the first exhaust seal 50. Here, there is a fear that the following problems can arise.

That is, in case where the moving block 30 moves to the left in FIG. 2, when gas molecules Am adsorbed to the upper surface of the moving block 30 are opposed to the groove portion 52 due to the left-ward movement of the moving block 30, a major part of them are sucked by the pumps P2 and further, when the remaining adsorbed gas molecules Am are opposed to the groove portion 51, most of them are sucked. However, the adsorbed gaseous molecules Am, which have not been sucked and thus remain still on the moving block 30 upper surface, are eliminated in the interior of the process chamber P, which raises a fear that the negative pressure (or specific gas) environment of the process chamber P can be damaged. In the case of porous ceramic material, the occluded gas molecules Am are also eliminated in the interior of the process chamber P.

On the other hand, according to the present embodiment, as shown FIG. 1, since the width b of the side wall 21 of the first box body 20 (that is, in FIG. 1, the right-and-left-direction length of the seal surface 50a of the first differential pumping seal 50) and the width b of the side wall 41 of the second box body 40 (that is, in FIG. 1, the right-and-left-direction length of the seal surface 60a of the second differential pumping seal 60) are set equal to or larger than the required maximum stroke S of the moving block 30 ($S \leq b$), the portion of the moving block 30 that is exposed to the exterior (the atmospheric pressure environment) of the process chamber P and decompression chamber R stays within the side wall 21 or side wall 41 even when the moving block 30 moves up to the maximum stroke S, thereby being able to restrict the gas molecules Am from being eliminated into the process chamber P and decompression chamber R. By the way, the moving block 30 serving as a moving member according to the present embodiment is made of metal material. However, in case where, instead of the metal material, the moving block 30 is made of ceramic material, there can be provided another advantage that the present moving block can be made light in weight and high in rigidity.

By the way, when the width b is larger than the thickness that is required of the side wall 21 of the first box body 20, only the right-and-left-direction (in FIG. 1) width (the width of the seal surfaces 50*a*, 60*a*) of the differential pumping seals 50, 60 may be set for b. That is, in the lower portion of the side wall 21 (upper portion of the side wall 41), there may be formed an edge portion which, in the right and left direction of FIG. 1, projects in the direction of the interior of the process chamber P, or in the direction of the atmospheric pressure side, or in both directions.

Further, description will be given below of a device for restricting the deformation of the moving block 30. Firstly, let us assume a case in which the second box body 40 is omitted. In this case, since the atmospheric pressure (about $10^5$ Pa) is always acting on the lower surface of the moving block 30, the central portion of the upper surface of the moving block 30 is deformed in such a manner that it is pulled upwardly in FIG. 1. Even in case where such deformation is slight, the height position of the table 31 varies, which makes it difficult to work a work with high accuracy.

On the other hand, in the present embodiment, since the second box body 40 is disposed opposed to the first box body 20 and the decompression chamber R formed in the interior of the second box body 40 is held in a negative pressure environment, the lower surface of the moving block 30 is pulled downwardly in FIG. 1 to thereby restrict the deformation of the moving block 30 due to the negative pressure of the process chamber P, which makes it possible to keep the moving block 30 substantially in a no-deformation state. This can prevent the height position of the table 31 from varying, so that the work positioning with high accuracy can be attained. Also, because the openings 20*a* and 40*a* are formed to have the same shape and are disposed opposed to each other, the deformation mode of the moving block 30 can be made to balance well and thus further-higher-accuracy positioning can be accomplished.

By the way, the degree of vacuum of the decompression chamber R need not be coincident with the degree of vacuum of the interior of the process chamber P; for example, when the pressure of the interior of the process chamber P is set at $10^{-5}$ Pa, even in case where the pressure of the decompression chamber R is set about $10^{-4}$ Pa (about $\frac{1}{10}$ of the atmospheric pressure), the degree of deformation of the moving block 30 can be reduced down to about $\frac{1}{10}$ of the degree of deformation that occurs in the structure excluding the decompression chamber R. Thanks to this, as the pump P3 of the decompression chamber R, there can be used a pump which is lower in capacity and lower in cost, which makes it possible to reduce the cost of the positioning apparatus. However, in case where there is formed in the moving block 30 a passage which allows the decompression chamber R and process chamber P to communicate with each other, there can be omitted the pump P3 for the decompression chamber R.

Figure 3:
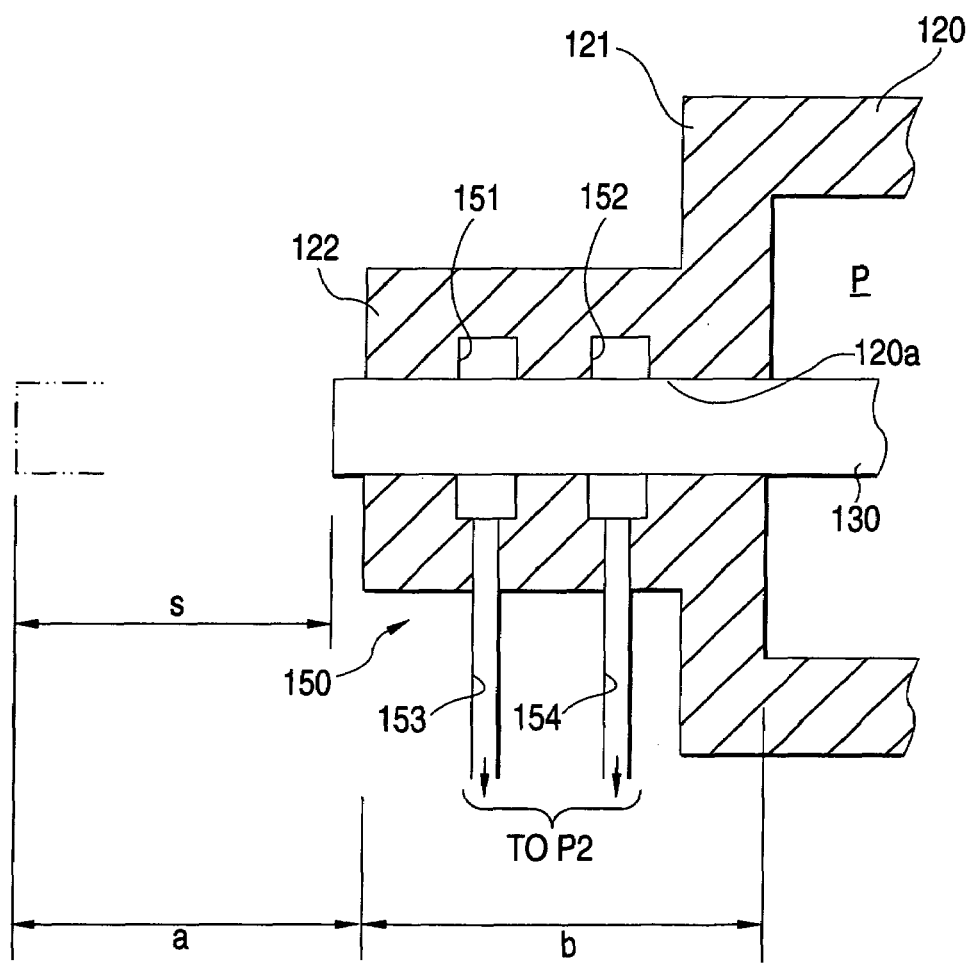
FIG. 3 is an enlarged section view of the periphery of a differential pumping seal employed in a positioning apparatus according to a second embodiment of the present invention.

Now, FIG. 3 is a section view of the periphery of a differential pumping seal used in a positioning apparatus according to a second embodiment of the present invention. In the embodiment shown in FIG. 3, a moving member consists of a round shaft 130, while the round shaft 130 penetrates through an opening 120*a* formed in the side wall 121 of a single box body 120. Only the portion of the side wall 121 surrounding the opening 120*a* is formed as a projecting portion 122; and, in the projecting portion 122, there are formed two peripheral grooves 151, 152 in such a manner that they are open to the opening 120*a*. And, there are further formed two exhaust passages 153, 154 in such a manner that they respectively extend outwardly from the peripheral grooves 151, 152. The exhaust passages 153, 154 are respectively connected to their associated pumps P2 (FIG. 1). By the way, a differential pumping seal 150 are composed of the two peripheral grooves 151, 152 and two exhaust passages 153, 154, while the opening 120*a* serves as the seal surface of the differential pumping seal 150 on the box body 120 side. The thickness of the wall of the side wall 121 except for the projecting portion 122 is controlled down to the thickness that is necessary for a box body 120. The round shaft 130 is supported by a bearing (not shown) on the atmospheric side and can be moved in the right and left direction in FIG. 3 by a proper drive part which is also disposed under the atmospheric pressure environment but is not shown in FIG. 3. Also, since the shaft 130 is a round shaft, as the need arises, the round shaft 130 can be driven so as to rotate about its axis.

In the present embodiment as well, as shown in FIG. 3, since the width b of the portion of the side wall 121 of the box body 120 that corresponds to the projecting portion 122 is set equal to or larger than the maximum strokes of the round shaft 130 ($S \leq b$), the portion of the round shaft 130 that is exposed to the outside of the box body 120 (to the atmospheric pressure environment) still stays within the projecting portion 122 even in case where the round shaft 130 is moved up to the maximum quantity S, thereby being able to restrict the gas molecules Am from being eliminated into the interior of a process chamber P formed in the interior of the box body 120.

Figure 4:
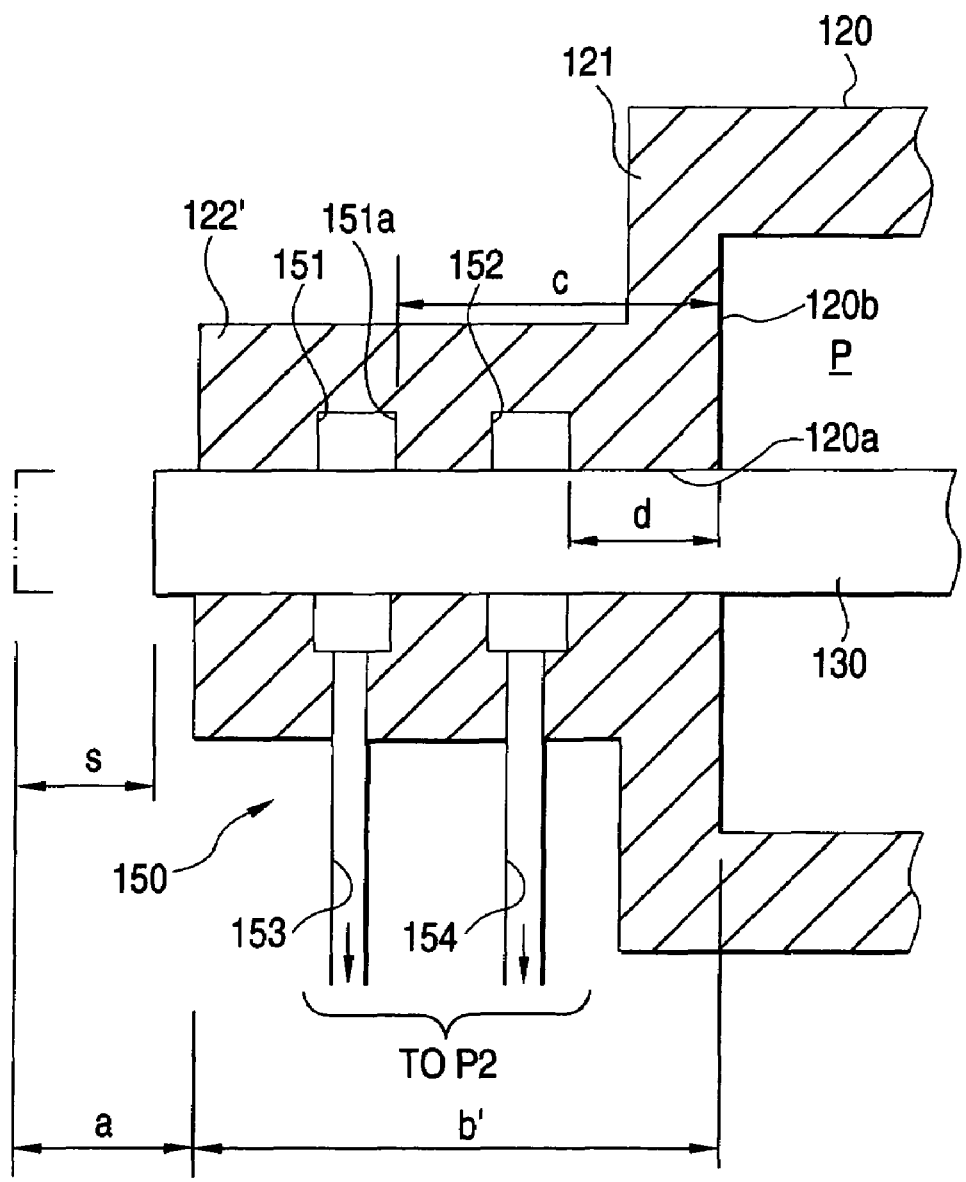
FIG. 4 is an enlarged section view of the periphery of a differential pumping seal employed in a positioning apparatus according to a third embodiment of the present invention; and, FIG. 5 is an enlarged section view of the periphery of a differential pumping seal employed in a positioning apparatus according to a fourth embodiment of the present invention.

Now, FIG. 4 is a section view of the periphery of a differential pumping seal used in a positioning apparatus according to a third embodiment of the present invention. The embodiment shown in FIG. 4 is similar in structure to the embodiment shown in FIG. 3 except that the width b' of a projecting portion 122' is set further larger than the maximum stroke amount S of the round shaft 130. Specifically, when the distance from the inner wall 120*b* of the process chamber P to the inner wall 151*a* of the peripheral groove 151 is expressed as c, the distance c is set in such a manner that the relationship $S \leq c$ can hold. Therefore, the width b' is set large correspondingly to this. The reason for this is as follows:

As can be judged from FIG. 2, at a position opposed to the peripheral groove (here, 151) that is nearer to the outside of the box body 120, when compared with a position opposed to the peripheral groove (here, 152) that is situated inwardly of the peripheral groove (151), the degree of vacuum on the surface of the round shaft 130 is relatively low. Therefore, it can be considered that gas molecules can be adsorbed in a small but some quantity to the surface of the round shaft 130 that is exposed to the peripheral groove 151. Thus, especially when high sealing performance is required, for example, when the interior of the process chamber P must be held in a high degree of vacuum, or when the moving speed of the round shaft 130 is high, in case where the above surface moves into the process chamber P, there is a fear the gas molecules adsorbed to the surface can be eliminated in the interior of the process chamber P. However, as in the present embodiment, in case where c and b' are set such that $S \leq c$ holds, at least the surface of the round shaft 130 that is exposed to the peripheral groove 151 is prevented from moving into the interior of the process chamber P and, therefore, even when high sealing performance is required, elimination of the gas molecules into the interior of the process chamber P can be restricted more effectively.

Further, in the case of $S \leq d$ shown in FIG. 4, of course, invasion of the gaseous molecules into the interior of the process chamber P can be restricted more effectively. However, in case where d increases, the width of the seal surface 120*a* increases correspondingly to this, which increases a possibility that the round shaft 130 and box body 120 can be contacted with each other. That is, when taking it into consideration that $S \leq c$ can sufficiently prevent the invasion of the gas molecules into the interior of the process chamber P, more preferably, $S \leq c$ may be employed.

Figure 5:
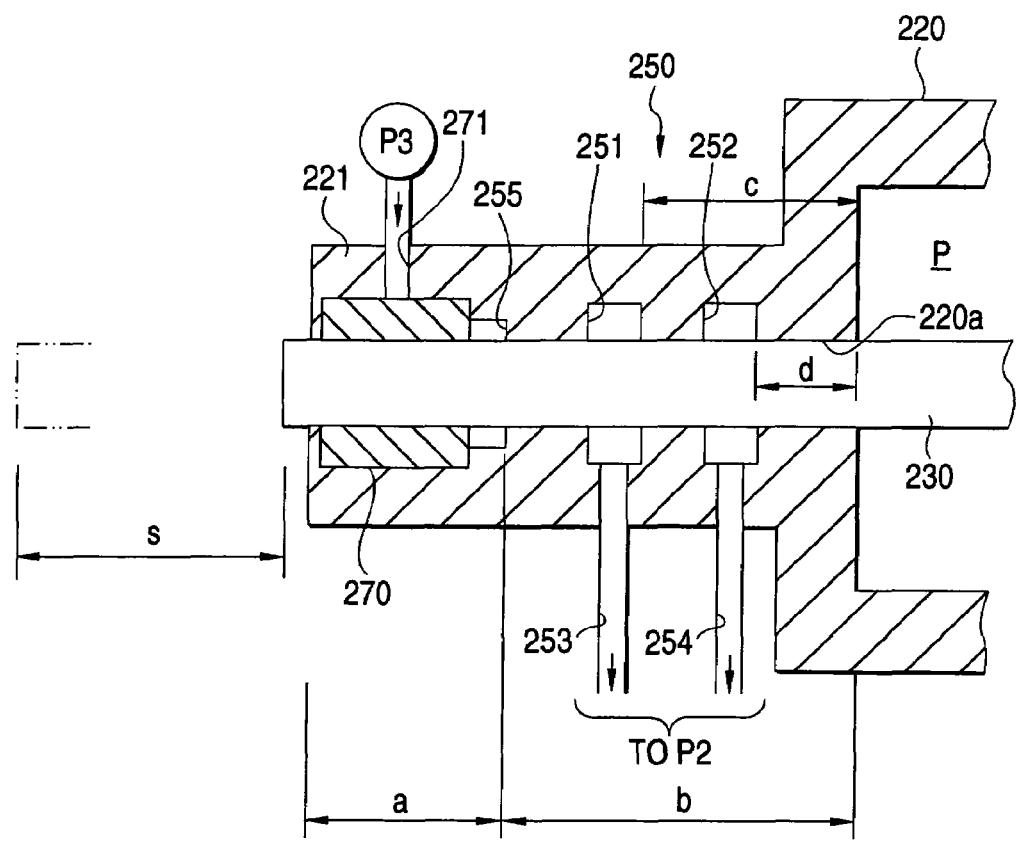

Now, FIG. 5 is a section view of the periphery of a differential pumping seal of a positioning apparatus according to a fourth embodiment of the present invention. Referring to the characteristic aspect of the structure of the embodiment shown in FIG. 5, the end portion of the box body 120 shown in FIG. 3 is extended so that a bearing can be disposed. Specifically, a round shaft 230 penetrates through a circular-shaped opening 220*a* formed in the long and narrow cylindrical-shaped projecting portion 221 of a box body 220. A differential pumping seal 250 comprises two peripheral grooves 251, 252 respectively open to the opening 220*a* and two exhaust passages 253, 254 respectively extending outwardly from their associated peripheral grooves 251, 252. On the left side (in FIG. 5) of the differential pumping seal 250, there is disposed a bearing 270 in the projecting portion 221 in such a manner that it is substantially flush (it may be perfectly flush) with the opening 220*a*. The bearing 270, which is a hydrostatic bearing, is connected to a pump P3 through a passage 271 formed so as to penetrate through the projecting portion 221 in the radial direction thereof and is used to support the round shaft 230 due to the positive pressure thereof in such a manner that the round shaft 230 can be moved. By the way, adjacently to the bearing 270, in the portion of the projecting portion 221 that is situated on the differential pumping seal 250, there is formed a space 255 (peripheral groove) open to the atmosphere through a passage (not shown). In the present embodiment, the portion of the opening 220*a* having a depth b shown in FIG. 5 provides the box body side seal surface of the differential pumping seal 250.

In the present embodiment, as shown in FIG. 5, since the distance (that is, the width of the seal surface) b between the process chamber P and space 255 is set equal to or larger than the maximum stroke S of the round shaft 230 ($S \leq ,b$), the portion of the round shaft 230 that is exposed to the space 255 (under the atmospheric pressure) still stays within the end portion 221 even in case where the round shaft 230 is moved up to the maximum stroke S, thereby being able to restrict the gas molecules Am from being eliminated into the interior of a process chamber P formed in the interior of the box body 220. Also, from the viewpoint of restriction of invasion of the gas molecules Am into the interior of the process chamber P, more preferably, similarly to the previously-described embodiments, c shown in FIG. 5 may be set such that $S \leq c$ or $S \leq d$ can hold.

Further, in order not only to minimize the adsorption of the gas molecules under the atmospheric pressure but also to promote the elimination of the gas molecules, as the gas that is supplied to the hydrostatic bearing 270 by the pump P3, preferably, there may be employed inert gas (for example, nitrogen gas and argon gas) which is hard to be adsorbed to the mating member of the hydrostatic bearing 270. With use of inert gas, in case where a and b shown in FIG. 5 are set such that $S \leq a+b$, the above effects can be obtained. And, because moisture is most disliked in the atmospheric environment, desirably, there may be set a dry (dehumidified) air atmosphere. Also, in case where an inert gas (such as $N_2$ gas) area is disposed only in the area just near to the seal area, the inert gas can be firstly adsorbed to the surface of the moving portion which moves from the vacuum area to the atmospheric environment, thereby being able to promote the elimination of the adsorbed gas molecules. As a specific structure for this, there can be proposed a structure in which the inert gas such as $N_2$ gas is pressure fed from the pump P3 to thereby fill the periphery of the bearing 270 with the inert gas.

In addition, with use of the inert gas, in case where b and c shown in FIG. 5 are set such that $S \leq b$ or $S \leq c$, the positioning apparatus of the present invention can be applied to the process chamber with strict condition, for example, which requires higher vacuum.

Although the present invention has been described heretofore using the preferred embodiments thereof, the present invention is not limited to these embodiments but, of course, various changes and improvements are also possible. For example, the moving block 30 may be moved in FIG. 1 not only in the right and left direction but also in a direction perpendicular to the figure sheet, that is, may be moved in a two-dimensional manner. In this case, the width b of the seal surface (not shown) of the side wall 21 extending in a direction perpendicular to the figure sheet is also set such that $S \leq b$ (in case where the stroke in a direction perpendicular to the figure sheet is S). However, it makes little sense to apply the present invention to a structure in which the round shafts 130, 230 are not moved in the axial direction thereof but are only rotated. Also, even in the case of such flat-surface-shaped moving block as shown in FIG. 1, the width thereof, which corresponds to c or d in FIG. 4 showing the third embodiment of the present invention, may also be set equal to or larger than S. Further, in the case of such flat-surface-shaped moving block as shown in FIG. 1, a hydrostatic bearing may also be disposed in combination with the moving block in such a manner that it is adjoins the moving block and is situated nearer to the atmospheric pressure side than the differential pumping seal. As the gas to be supplied to the hydrostatic bearing, there may be used inert gas. In this case, the width of the surface of the box body that is opposed to the moving block can be decided in accordance with the fourth embodiment of the present invention.

Figure 6:
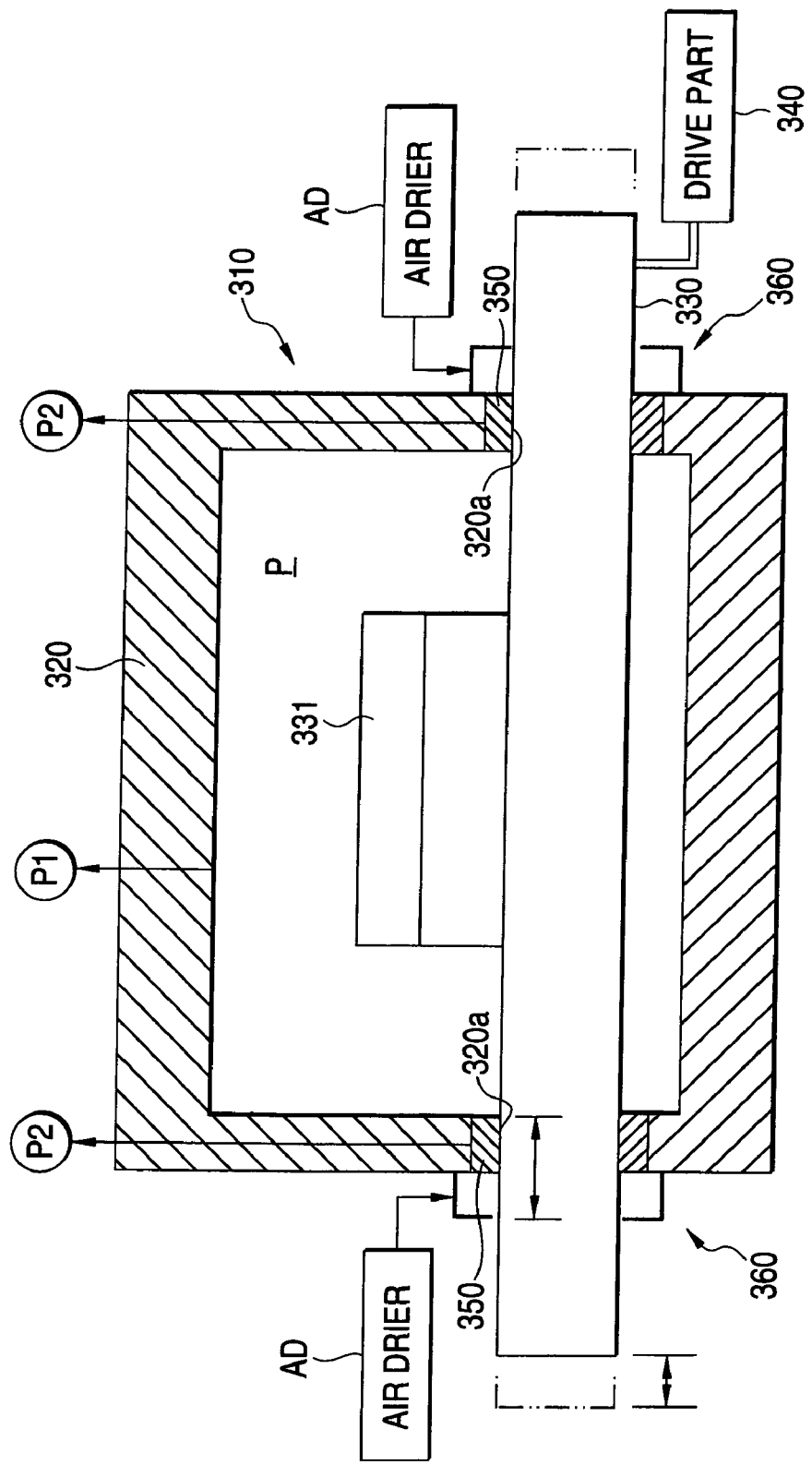
FIG. 6 is a front section view of a positioning apparatus according to a fifth embodiment of the present invention.
Figure 7:
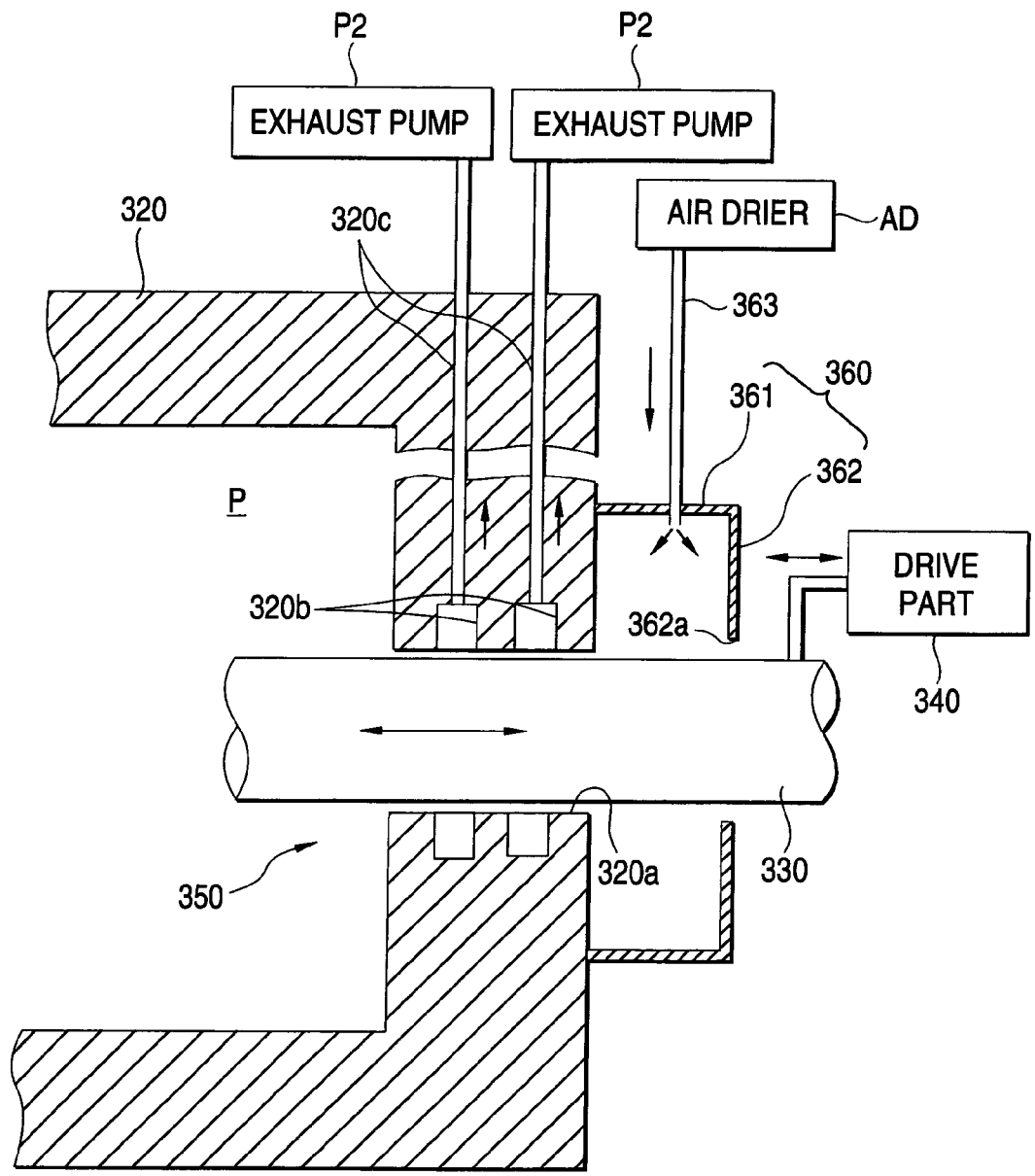
FIG. 7 is a partially omitted enlarged section view of the periphery of a differential pumping seal having a structure shown in FIG. 6.

Now, description will be given below of the preferred embodiments of a positioning apparatus according to the present invention with reference to the accompanying drawing. FIG. 6 is a front section view of a positioning apparatus according to a fifth embodiment of the present invention, with a differential pumping seal shown in a typified manner. FIG. 7 is a partially omitted enlarged section view of the periphery of the differential pumping seal having the structure shown in FIG. 6.

As shown in FIG. 6 or 7, a positioning apparatus 10 according to the present embodiment comprises a box body 320 including not only a process chamber P formed in the interior thereof but also two circular-shaped openings 320*a*, 320*a* respectively formed in the two side walls thereof for allowing the interior of the process chamber P to communicate with the outside of the process chamber P, a moving shaft 330 serving as a moving member disposed so as to penetrate through the two openings 320*a*, 320*a*, a drive part 340 for driving the moving shaft 330, two differential pumping seals 350, and two cover members 360. The interior of the process chamber P is sucked by an exhaust pump P1 through a pipe which is shown in a simplified manner in FIG. 6 to thereby provide a negative pressure environment.

The moving shaft 330, the two end portions of which are respectively supported by bearings (not shown), can be moved in the right and left direction in FIG. 6 by the drive part (for example, a combination of a motor and a ball screw, or a linear motor) 340 disposed under the atmospheric pressure, and also carries on the central portion thereof a table 31 for supporting a work (not shown). The inner peripheral surfaces of the openings 320a, 320a of the box body 320 constitute the exhaust surfaces of the differential pumping seals 350, 350. The differential pumping seals 350, 350 are respectively sucked by their associated exhaust pumps P2, P2 through pipes (which are shown in a simplified manner in FIG. 6) to thereby seal the interior and exterior of the process chamber P against each other.

In FIG. 7, in the inner peripheral surface of the opening 320a on the right side, there are formed a pair of peripheral grooves (which are also referred to as differential pressure chambers) 320b, 320b. The interiors of these peripheral grooves 320, 320b are respectively sucked by exhaust pumps P2, P2 through exhaust holes 320c, 320c penetrating through the side wall of the box body 320 to thereby provide negative pressure environments. The thus-formed negative pressure environments of the peripheral grooves 320, 320b suck gas existing in a slight clearance between the opening 320a and moving shaft 330 to thereby perform the sealing function.

As shown in FIG. 7, on the exterior side of the box body 320, adjacently to the opening 320a, there is disposed the cover member 360 which is composed of a cylindrical portion 361 and a flange portion 362 having an opening 362. The moving shaft 330 penetrates through the opening 362 of the flange portion 362. The dry air can be supplied through a pipe 363 from an air drier AD to a space existing in the interior of the cover member 360. The air drier (which is also referred to as an air supply apparatus) AD is used to remove foreign substances such as moisture from the air and supply the clean air. For example, there is available an air drier which cools the compressed air, separate the condensed moisture therefrom, and then return it to its original pressure. Also, there can be used other various types of air driers such as an air drier of a so called heatless type and a membrane air drier. Or, there may also be used an air drier structured such that it sucks in the air and passes the air through a chamber with a desiccant contained therein to thereby obtain the dry air. The dimension of the cover member 360 is set such that, even in case where the moving shaft 330 moves up to the maximum amount, at least the portion of the moving shaft 330 movable into the interior of the process chamber P can be prevented from moving externally of the cover member 360. By the way, the differential pumping seal 350 and cover member 360, which are disposed on the left side, are similar in structure to the above-mentioned differential pumping seal 350 and cover member 360 on the right side.

In case where the moving shaft 330 moved in the axial direction thereof, when the gas molecules adsorbed to the surface of the moving shaft 330 become opposed to the peripheral groove 320b situated on the exterior side due to the movement of the moving shaft 330, most of them are sucked by the pumps P2; and also, when the gas molecules become opposed to the peripheral groove 320b situated on the interior side, most of the remaining gas molecules are sucked; whereas the still unsucked and remaining gas molecules are eliminated in the interior of the process chamber P, thereby raising a fear that the-thus-eliminated gas molecules can degrade the negative pressure (or specific gas) environment. In view of this, in the present embodiment, the exterior side of the opening 320a is covered with the cover member 360 and the interior of the cover member 360 is filled with the dry air (that is, the air with the moisture removed therefrom) supplied by the air drier AD to thereby restrict the adsorption of the gas molecules (especially, the molecules of water) to the surface of the moving shaft 330. Thus, according to the present embodiment, the above-mentioned problem found in the conventional positioning apparatus can be solved.

By the way, as shown in the test results that will be discussed later, preferably, in case where the dry air filling the interior of the cover member 360 is the air having such humidity capable of restricting a change in the pressure of the interior of the process chamber P due to the movement of the moving shaft 330 down to 30% or less (that is, such humidity of less than 50%) when the environment (the air) of the outside of the box body 320 is filled with the air having humidity of 50%, the amount of gas to be released into the interior of the process chamber P can be restricted further. Also, more preferably, in case where the dry air is the air having humidity of 10% or less at room temperature and under the atmospheric pressure (the air having such humidity that, in the vicinity of the exit of the air from the air drier AD, provides the dew-point temperature of −15° or lower with respect to the atmospheric pressure in the environment of the outside of the box body 320), the amount of gas to be released into the interior of the process chamber P can be restricted still further.

Especially, according to the present embodiment, as the base material of the moving shaft 330, there can be used stainless steel such as SUS304 which is easy to obtain. Also, even in case where a special surface treatment is not enforced on the surface of the moving shaft 330, or even in case where such precise work as to control the surface roughness down to a low level is not enforced on the surface of the moving shaft 330, the amount of the gas molecules to be adsorbed to the surface of the moving shaft 330 can be restricted similarly to a case in which the interior of the cover member 360 is filled with the inert gas. Thanks to this, the present embodiment can provide a positioning apparatus which is lower in cost.

Figure 8:
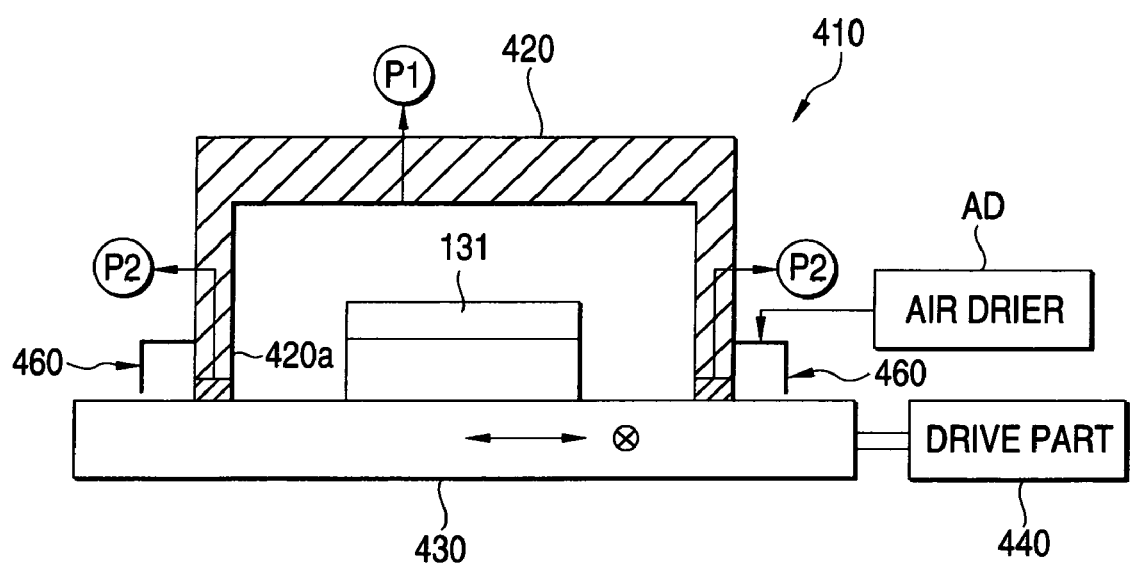
FIG. 8 is a front section view of a positioning apparatus according to a sixth embodiment of the present invention.
Figure 9:
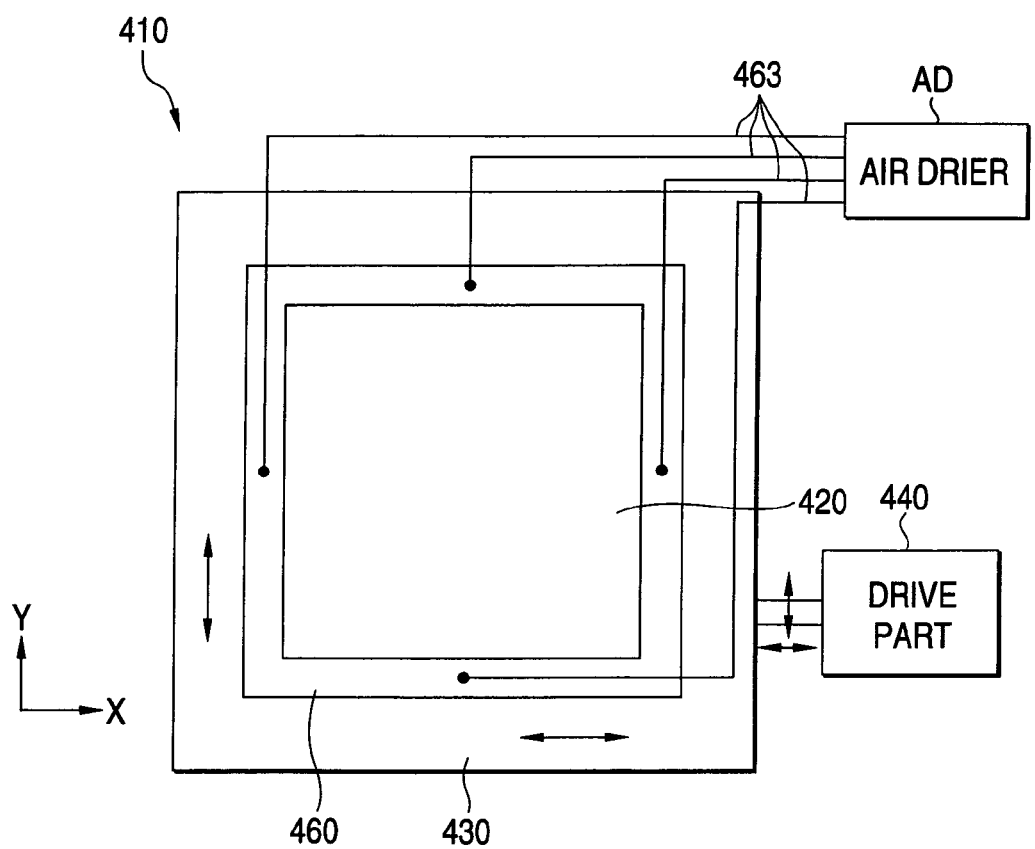
FIG. 9 is a plan view of a positioning apparatus according to the sixth embodiment of the present invention.
Figure 10:
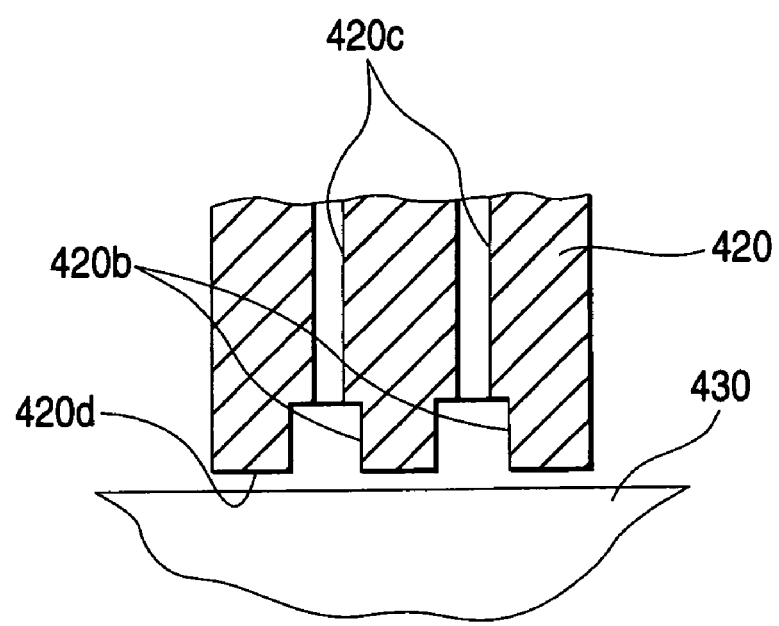
FIG. 10 is a partially omitted enlarged section view of the periphery of a differential pumping seal having a structure shown in FIG. 8.

Next, description will be given below of a positioning apparatus according to a sixth embodiment of the present invention. FIG. 8 is a front section view of a positioning apparatus according to the sixth embodiment, with a differential pumping seal shown in a typified manner. FIG. 9 is a plan view of the present positioning apparatus and FIG. 10 is a partially omitted enlarged section view of the periphery of the differential pumping seal having the structure shown in FIG. 8. The present embodiment employs a structure in which a moving member can be moved in a two-dimensional manner, that is, it can be moved in the X-axis direction and in the Y-axis direction extending at right angles to the X-axis direction.

As shown in FIG. 9, the present positioning apparatus 410 comprises a box body 420 fixed by suitable means (not shown) and including an opening 420a formed instead of the bottom wall thereof and a process chamber P formed in the interior thereof, a plate-shaped moving member 430 disposed so as to shield the opening 420a of the box body 420, a drive part 440 for moving the moving member 430 in a two-dimensional manner, a differential pumping seal 150, and a cover member 460. The interior of the process chamber P is sucked by a pump P1 through a pipe (shown in a simplified manner) to thereby provide a negative pressure environment.

The moving member 430 is supported by a bearing (not shown), can be moved in the vertical direction and in the horizontal direction in FIG. 10 by the drive part (for example, a combination of a motor and a ball screw, or a linear motor) 440, and carries on the central portion thereof a table 431 for supporting a work (not shown). On the surface of the periphery of the opening 420a of the box body 420 that is opposed to the moving member 430, there is disposed the differential pumping seal 150 with a slight clearance between the moving member 430 and itself. More specifically, in FIG. 10, in the peripheral surface 420d of the opening 420a, there are formed a pair of grooves (differential pressure chambers) 420b, 420b so as to extend along the entire periphery of the peripheral surface 420d. The interiors of the grooves 420b, 420b can be respectively sucked by their associated exhaust pumps P2 (FIG. 8) through exhaust holes 420c, 420c penetrating through the side wall of the box body 420, so that the interiors of the grooves 420b, 12b can provide negative pressure environment, respectively. The negative pressure environments can suck gas existing in the slight clearance between the peripheral surface 420d of the opening 420a and moving member 430 to thereby be able to perform the sealing function.

As shown in FIGS. 9 and 10, the cover member 460 having an L-shaped section is disposed over the entire periphery of the box body 420 in such a manner that it covers the opening 420a of the box body 420. To a space formed in the interior of the cover member 460, there can be supplied the dry air from an air drier AD through a pipe 463. The dimension of the cover member 460 is set such that, even when the moving member 430 moves by the maximum amount, at least the portion of the moving member 430 moving into the interior of the process chamber P can be prevented from moving externally of the cover member 460.

In the present embodiment as well, the exterior side of the opening 420a is covered with the cover member 460 and the interior of the cover member 460 is filled with the dry air (the air with the moisture removed therefrom) supplied by the air drier AD to thereby turn the interior of the cover member 460 into the dry air environment, which makes it possible to restrict the adsorption of the gas molecules (especially, the molecules of water) to the surface of the moving shaft 430 and thus maintain the environment of the interior of the box body 420.

Figure 11:
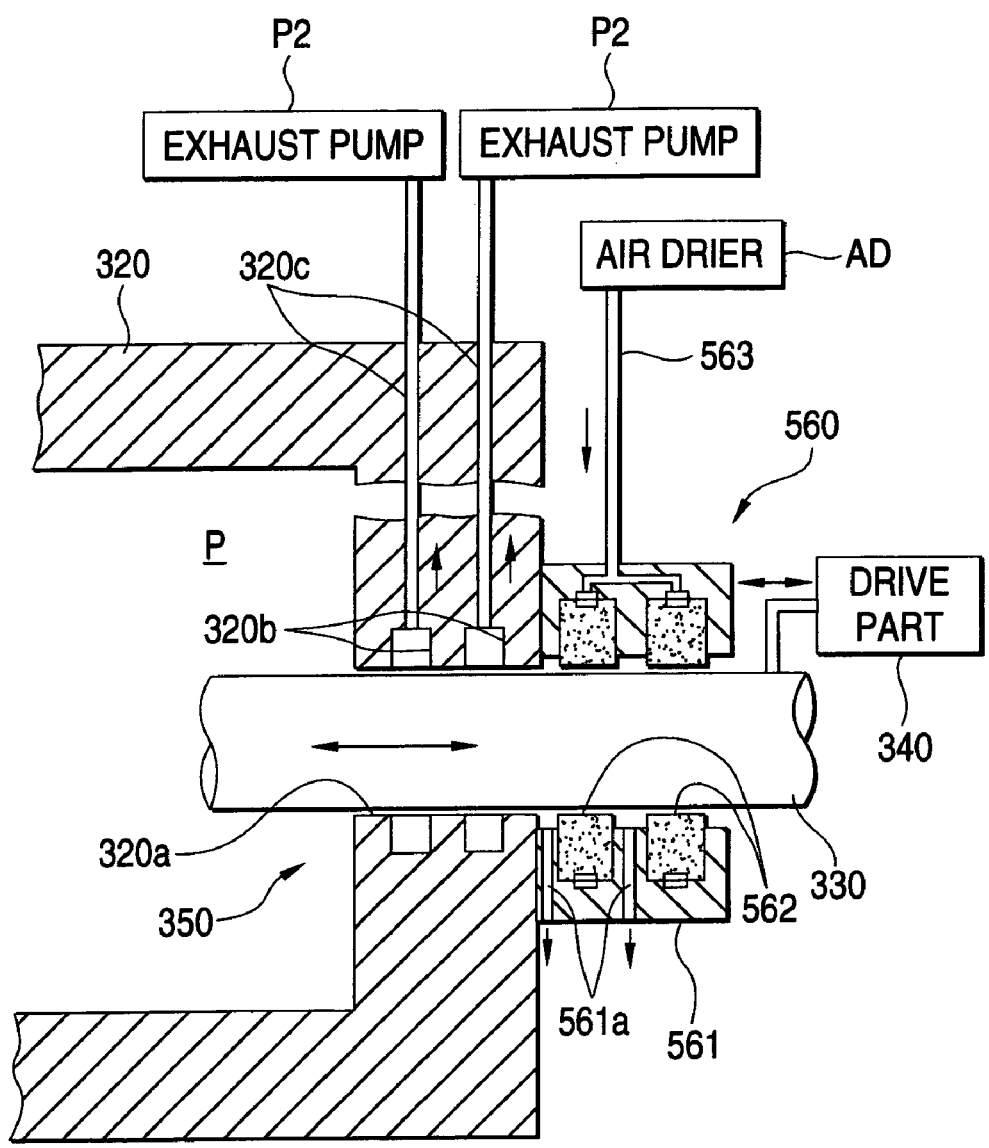
FIG. 11 is a partially omitted enlarged section view of the periphery of a differential pumping seal used in the seventh embodiment of the present invention.

Next, description will be given below of a positioning apparatus according to a seventh embodiment of the present invention. FIG. 11 is a partially omitted section view of the periphery of a differential pumping seal employed in a positioning apparatus according to the seventh embodiment. By the way, the seventh embodiment is different from the fifth embodiment mainly in that, instead of the cover member, there is disposed a hydrostatic bearing having the function of the cover member. Therefore, description will be given mainly of the hydrostatic bearing and thus the duplicate description of the remaining portions is omitted here.

In FIG. 11, on the exterior side of the box body 320, adjacently to the opening 320a, there is disposed a hydrostatic bearing 560. The hydrostatic bearing 560 comprises a cylindrical-shaped support portion 561 mounted on the box body 320 and a pair of ring-shaped jet-out portions 562, 562 made of porous material and disposed on the inner periphery of the support portion 561. The jet-out portions 562, 562 are opposed to the surface of the moving shaft 330 with a slight clearance between them and jet out the dry air supplied from the air drier AD through a pipe 563 into the slight clearance. The support portion 561 includes exhaust holes 561a, 561a which are disposed adjacent to the jet-out portions 562 and allow the inner and outer peripheries of the support portion 561 to communicate with each other. By the way, provision of the hydrostatic bearing 560 eliminates the need for provision of the guide mechanism (not shown) for the moving shaft 330 in the first embodiment. The dimension of the hydrostatic bearing 560 may be preferably set such that, even in case where the moving shaft 330 moves up to the maximum amount thereof, at least the portion of the moving shaft 330 moving into the interior of the process chamber P can be prevented from moving externally of the hydrostatic bearing 560 (more preferably, outwardly of the exterior side end portion position of the jet-out portion 562 situated near to the exterior side (the atmospheric environment side)).

In the present embodiment, when in operation, since the air supplied from the air drier AD is jetted out from the jet-out portions 562 into the slight clearance defined by and between the jet-out portions 562 and the surface of the moving shaft 330, the moving shaft 330 is supported in a floating state due to the pressure of the jetted-out air, whereby the moving shaft 330 is supported in such a manner that it can be moved with low friction. Also, because the space enclosed by the hydrostatic bearing 560 is filled with the dry air (the air with the moisture removed thereof) supplied from the air drier AD, the adsorption of the gas molecules to the surface of the moving shaft 330 can be restricted to thereby be able to maintain the environment of the interior of the box body 320. According to the present embodiment, the support and guide of the moving shaft 330 as well as the formation of the dry air environment can be attained only by the hydrostatic bearing 560, which can contribute to a reduction in the number of parts.

(Description of the Results of Tests)

Figure 12:
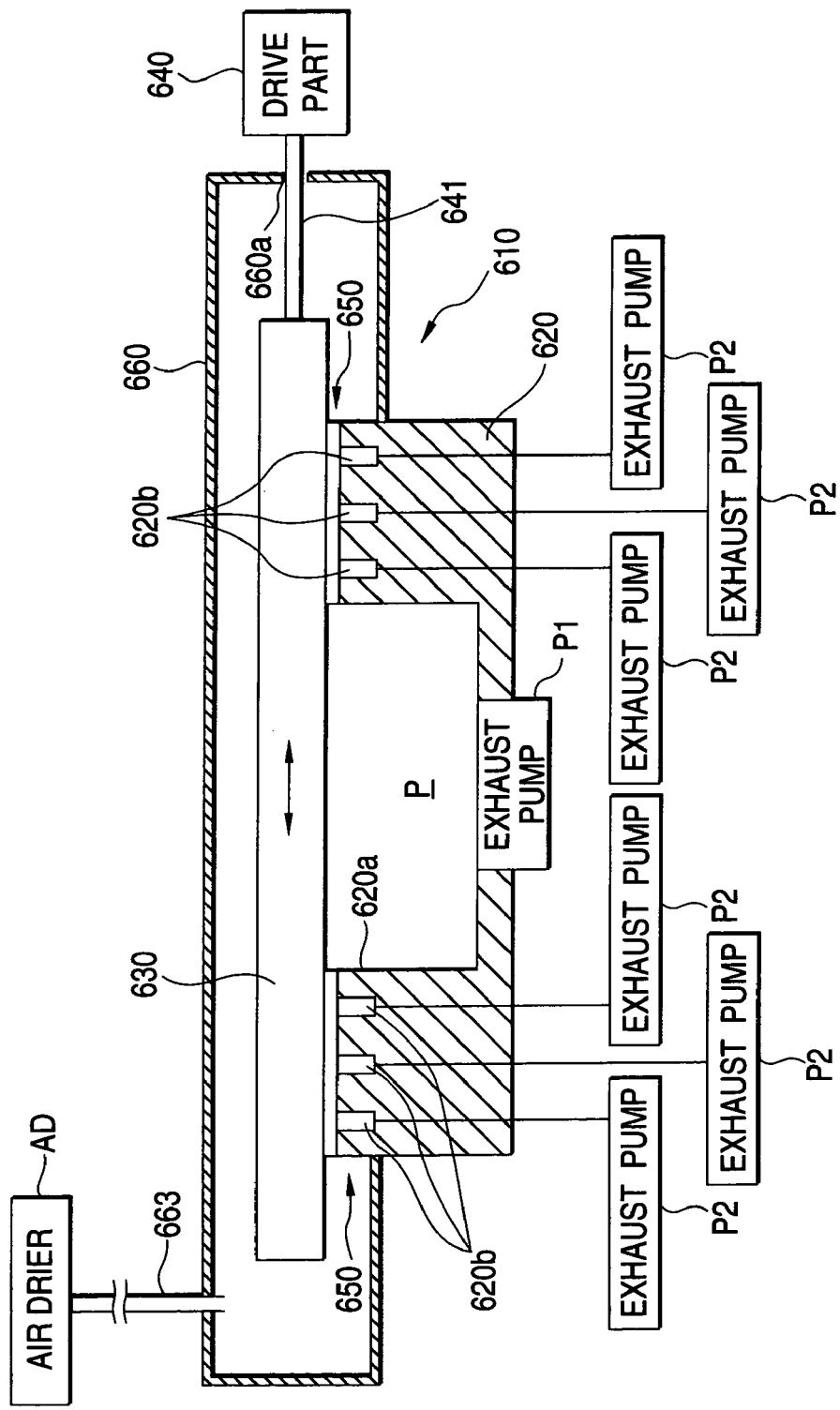
FIG. 12 is a front section view of a positioning apparatus which is a test apparatus used in a test conducted by the inventors.

Now, description will be given below of the results of tests conducted by the inventors. FIG. 12 is a front section view of a positioning apparatus which is a test apparatus used in a test conducted by the inventors, while a differential pumping seal is shown in a typified manner. The present positioning apparatus is similar to the positioning apparatus according to the sixth embodiment. However, since the structure of the present positioning apparatus is simplified, the moving direction of a moving member is set only in the right and left direction in FIG. 12.

As shown in FIG. 12, the present positioning apparatus 610 comprises a box body 620 including an opening 620a formed instead of the top wall thereof and a process chamber P formed in the interior thereof, a plate-shaped moving member 630 disposed so as to shield the opening 620a of the box body 620, a drive part 640 for moving the moving member 630 in the right and left direction in FIG. 12, a differential pumping seal 650, and a cover member 660. The process chamber P is sucked by an exhaust pump P1 through a pipe shown in a simplified manner to thereby provide a negative pressure environment.

The moving member 630 is supported by a bearing (not shown), can be moved in the right and left direction in FIG. 12 by the drive part (for example, a combination of a motor and a ball screw, or a linear motor) 640. On the surface of the periphery of the opening 620a of the box body 620 that is opposed to the moving member 630, there is disposed the differential pumping seal 650 with a slight clearance between the moving member 630 and itself. More specifically, in FIG. 12, in the peripheral surface 620d of the opening 620*a*, there are formed a pair of grooves (differential pressure chambers) 620*b*, 620*b* so as to extend along the entire periphery of the peripheral surface 620*d*. The interiors of the grooves 620*b*, 620*b* can be respectively sucked by their associated exhaust pumps P2 through pipes which are shown in a simplified manner in FIG. 12 and penetrate through the side wall of the box body 620, so that the interiors of the grooves 620*b*, 620*b* can provide negative pressure environments respectively. The negative pressure environments can suck gas existing in the slight clearance between the peripheral surface 620*d* of the opening 620*a* and moving member 630 to thereby be able to perform the sealing function.

As shown in FIG. 12, the box-shaped cover member 660 envelops the moving member 630, while the cover member 660 covers the opening 620*a* of the box body 620 with such a sufficient dimension that does not interfere with the movement of the moving member 630. A connecting rod 641, which allows the drive part 640 and moving member 630 to communicate with each other, penetrates through a hole 660*a* formed in the cover member 660. Also, to a space defined in the interior of the cover member 660, there can be supplied a given kind of gas through a pipe 663 from an air drier AD (however, in the case of a comparison example 1 to be discussed later, the air drier AD is removed and the air as it is is introduced into the process chamber P; and, in the case of a comparison example 2 to be also discussed later, the air drier AD is replaced by a gas source which is used to introduce nitrogen gas into the interior of the process chamber P).

Test conditions in the present test are as follows:
(1) Operation Pattern
   0–70 sec: Moving member 630 stops.
   70–150 sec: Moving member 630 reciprocates at a low speed (50 mm/sec)
   150 sec–430 sec: Moving member 630 stops.
   430 sec–600 sec: Moving member 630 reciprocates at a high speed (100 mm/sec)
   600 sec-: Moving member 630 stops.
(2) Test Environment
   Room temperature (Box body outside temperature): 23° C.
   Humidity (Box body outside humidity): 50%

Figure 13:
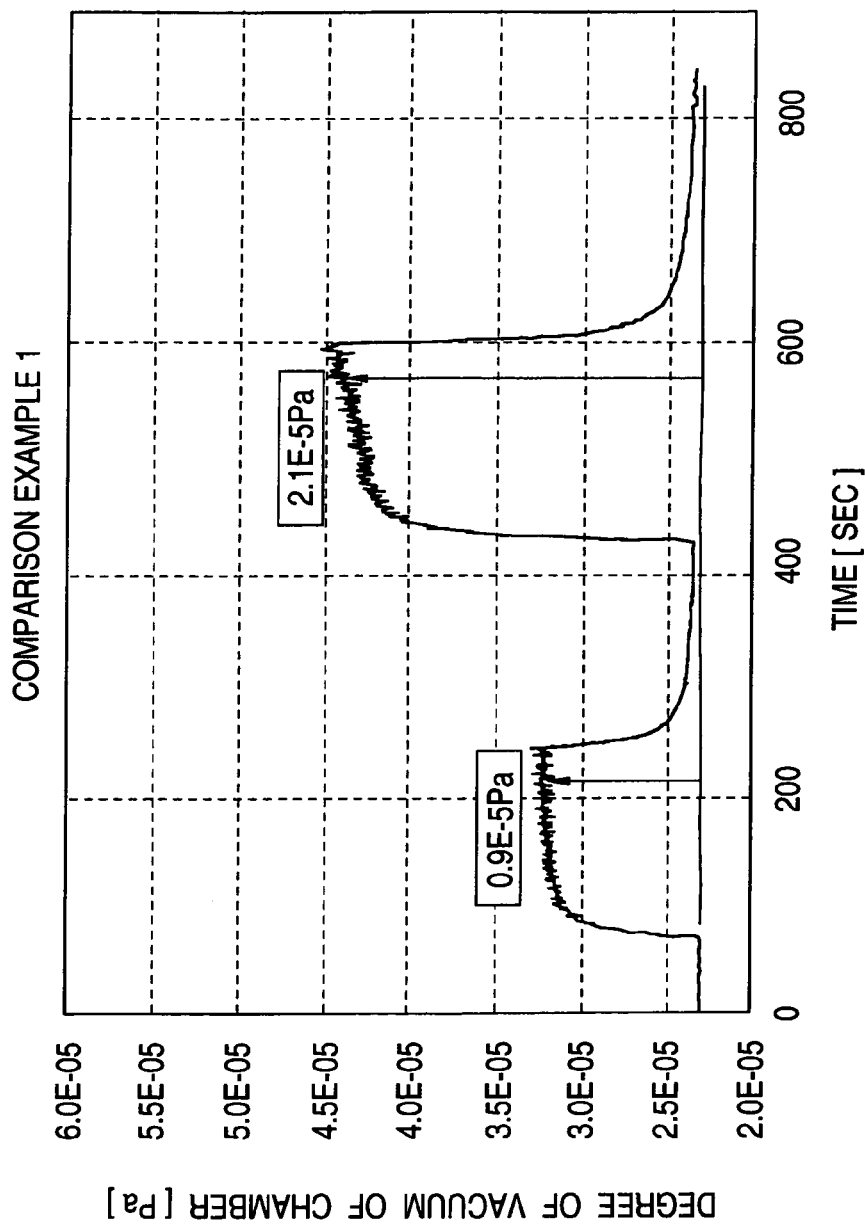
FIG. 13 is a graphical representation of the results of a test conducted on a comparison example 1.

Now, FIG. 13 is a graphical representation of the results of a test conducted on the comparison example 1 (in a state where nothing is connected to the pipe 663) in which the air is supplied into the cover member 660. As shown in FIG. 13, the maximum value of variations in the pressure in the interior of the box body 620 was 2.1E-5 (which corresponds to $2.1 \times 10^{-5}$; and, also which applies similarly hereinbelow as well) Pa.

Figure 14:
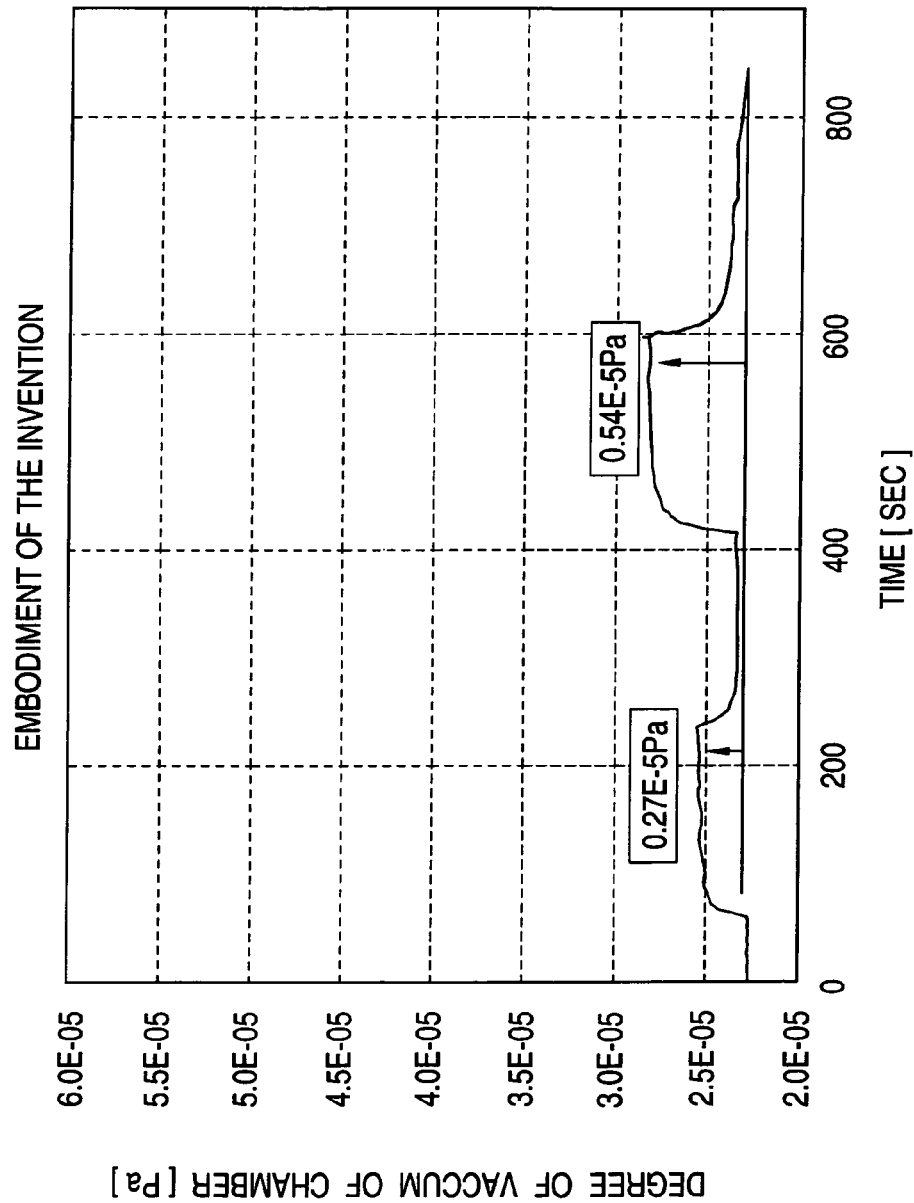
FIG. 14 is a graphical representation of the results of a test conducted on an embodiment according to the present invention; and, FIG. 15 is a graphical representation of the results of a test conducted on a comparison example 2.
Figure 15:
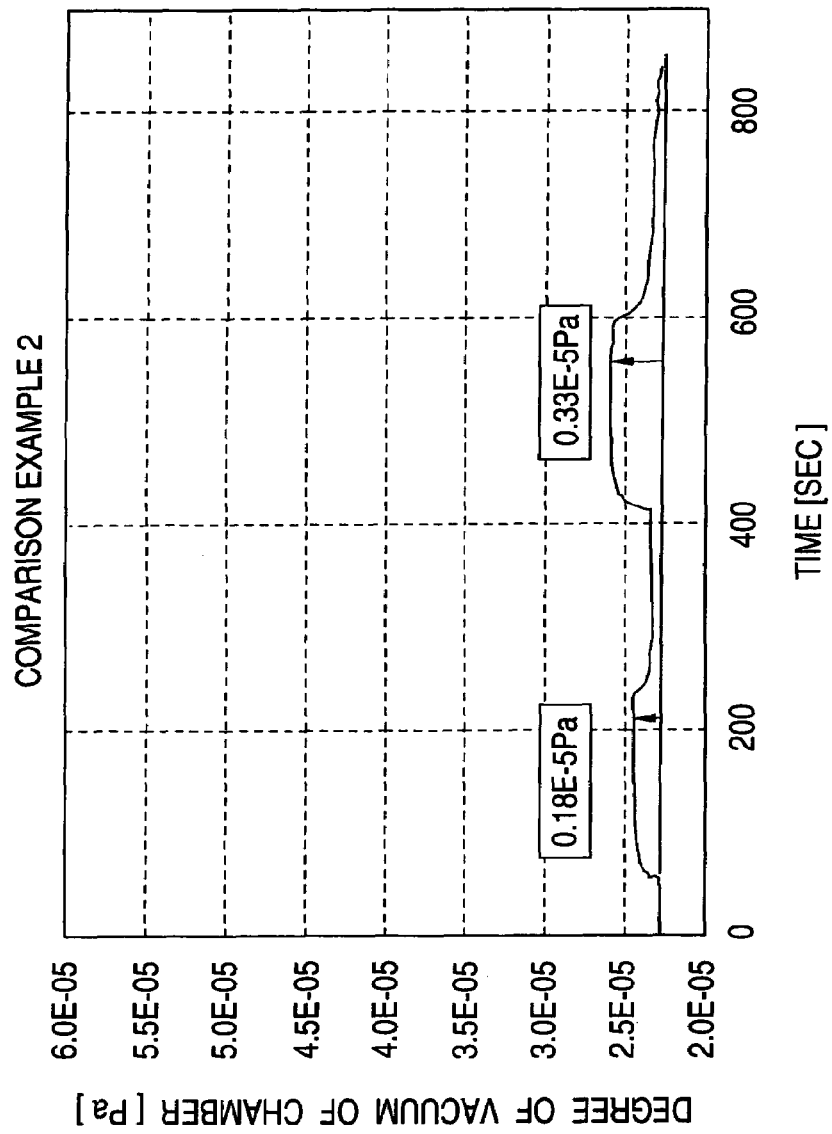

Now, FIG. 14 is a graphical representation of the results of a test conducted on an embodiment according to the present invention in which the dry air is supplied from the air drier AD so that the dew-point temperature with respect to the atmospheric pressure can be –15° C. in the exit portion from the air drier AD (in the interior of the cover member 660, the humidity of about 10%). As shown in FIG. 15, the maximum value of variations in the pressure in the interior of the box body 620 was 0.54E-5 Pa.

FIG. 15 is a graphical representation of the results of a test conducted on the comparison example 2 in which there is used an inert gas (nitrogen gas) cylinder as a gas source, and nitrogen gas having a dew-point temperature of –65° C. with respect to the atmospheric pressure (humidity of about 0.04% in the interior of the cover member 660) was supplied to the interior of the cover member 660. As shown in FIG. 11, the maximum value of variations in the pressure in the interior of the box body 620 was 0.33E-5 Pa.

From the above test results, it has been found that, in the case of the present embodiment, when compared with the case in which the interior of the cover member 660 is filled with the air (atmospheric pressure), since the interior of the cover member 660 is filled with the dry air, variations in the pressure can be reduced up to 30%. Also, when the case in which the interior of the cover member 660 is filled with the dry air is compared with the case in which the interior of the cover member 660 is filled with the inert gas, the latter case using the inert gas is better in restricting the variations in the pressure than the former case using the dry air; however, the difference between them is small. On the other hand, in case where the gas to be supplied is the air, there is no need for provision of a facility for collecting the air after it is exhausted. That is, when taking the cost of the facilities into consideration, it has been found that the structure according to the present embodiment is advantageous over the structure using the inert gas.

By the way, as described above, the dry air with humidity of 10% can provide sufficient performance (that is, can maintain the environment of the interior of the process chamber). However, in case where the humidity is reduced down to a level of less than 10%, of course, there can be obtained better results. For example, as an air drier, there is available an air drier of a heatless type which can obtain the air having a dew-point temperature of –50° C. In case where the air drier of a heatless type is used, the humidity can be reduced down to about 0.5%.

Although description has been given hereinbefore of the preferred embodiments of the present invention, the present invention is not limited to these embodiments but, of course, various changes and improvements are also possible. For example, in the above embodiments, the term "moving member" means a member which moves with respect to the box body. However, instead of the moving member, the box body may be driven or moved.

Figure 16:
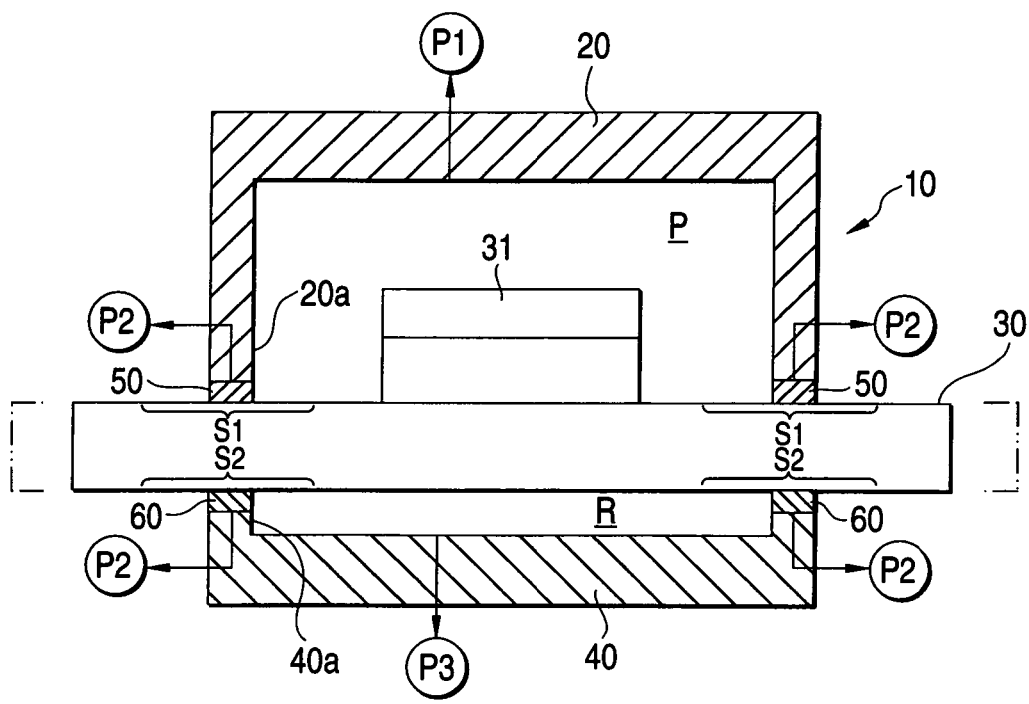
FIG. 16 is a front section view of a positioning apparatus 10 according to an eighth and a ninth embodiments of the present invention.

Description will be given below of an eighth embodiment of a positioning apparatus according to the present invention with reference to the accompanying drawings. FIG. 16 is a front section view of a positioning apparatus according to the eighth embodiment of the present invention, while a differential pumping seal is shown in a simplified manner. By the way, the eighth embodiment is different from the first embodiment mainly in that, the entire portions of the moving block 30 or the portions of the moving block 30 that correspond to areas S1 are formed of close-density material. Therefore, the duplicate description of the remaining portions is omitted here.

Now, as described above, FIG. 2 is an enlarged section view of the periphery of the first differential pumping seal 50, showing the absorption or occlusion and elimination of gas molecules in a typified manner. The first differential pumping seal 50 includes openings 51, 52 opposed to the surface of the moving block 30 and passages 53, 54 in communication from the openings 51, 52 to a pump P2 which is disposed externally of the positioning apparatus. Here, in case where the whole moving block 30 is formed of porous ceramic material, there is a fear that the following problems can arise.

In case where the moving block 30 moves to the left in FIG. 2, since the upper surface of the moving block 30 is formed of porous material, a major part of the absorbed or occluded gas molecules Am are sucked when they become opposed to the opening 52 due to the movement of the moving block 30; and further, when they become opposed to the opening 51, almost all of the remaining occluded gas molecules Am are sucked. However, the unsucked remaining occluded gas molecules Am can be eliminated in the interior of the process chamber P, thereby raising a fear that the negative pressure (or specific gas) environment of the process chamber P can be impaired. Therefore, in case where the entire portions of the moving block 30 or the portions of the moving block 30 that correspond to areas S1 are formed of close-density material, the absolute quantity of gas molecules Am to be adsorbed or occluded to the surface of these portions can be reduced as much as possible, thereby being able to solve the above problem.

Next, description will be given below of the ninth embodiment of a positioning apparatus according to the present invention. The present embodiment is similar in structure to the first embodiment but is different therefrom in that the mother material of a moving block 30 serving as a moving member according to the present embodiment is composed of porous ceramic material and the required portions of the moving block 30 are covered with coatings. In this case, not only the moving block 30 is light in weight and high in rigidity, but also there can be obtained the following advantages. That is, in FIG. 16, the areas S1 of the upper surface of the moving block 30, which are disposed with the first differential pumping seals between them, are able to move into or out of the process chamber P as the moving block 30 moves and, therefore, the areas S1 are exposed not only to be atmospheric pressure environment but also to a negative pressure environment (or a specific gas environment). Accordingly, in the present embodiment, the surfaces of the areas S1, which are formed of normal ceramic material and thus in which adsorption and elimination of the gas molecules Am are easy to occur, are coated with CVD films, thereby being able to control the adsorption of the gaseous molecules Am. This provides an outstanding effect that the environment of the interior of the process chamber P can be protected effectively. Such coating is especially effective on the high-vacuum side which is equal to or higher in vacuum than $10^{-3}$ Pa. By the way, of course, the entire upper surfaces of the moving block 3, or the entire upper surfaces of the moving block 30, or the entire interior portion of the moving block 30 including the areas S1 of the upper surfaces thereof can also be coated with the CVD films. Referring to the portions which exist inside the areas S1, in case where they are washed sufficiently before they are inserted into the interior of the process chamber P for the first time, since they are always present within the process chamber P from that time on, they raise no problem even when the porous mother material is exposed to the surfaces thereof; however, in case where these portions are also coated with the CVD films, there is obtained an advantage that the above-mentioned pre-treatment can be executed in a short time. The thickness of the coating may be the thickness that not only can prevent the permeation of the gas (gas molecules) through the coating but also can provide proper surface roughness.

Further, description will be given below of a device for restricting the deformation of the moving block 30. Firstly, let us assume a case in which the second box body 40 is omitted. In this case, since the atmospheric pressure (about $10^5$ Pa) is always acting on the lower surface of the moving block 30, the central portion of the upper surface of the moving block 30 is deformed in such a manner that it is pulled upwardly in FIG. 1. Even in case where such deformation is slight, because the height position of the table 31 varies, it is difficult to work a work with high accuracy.

On the other hand, in the above-mentioned first and second embodiments, since the second box body 40 is disposed opposed to the first box body 20 and the decompression chamber R formed in the interior of the second box body 40 is held in the negative pressure environment, the lower surface of the moving block 30 is pulled downwardly in FIG. 1 to thereby restrict the deformation of the moving block 30 due to the negative pressure of the process chamber P, which makes it possible to keep the moving block 30 substantially in a no-deformation state. Therefore, since the height position of the table 31 is prevented from varying, the work positioning with high accuracy can be attained. Also, because the openings 20a and 40a are formed to have the same shape and are disposed opposed to each other, the deformation mode of the moving block 30 can be made to balance well and thus further-higher-accuracy positioning can be accomplished.

By the way, the degree of vacuum of the decompression chamber R need not be coincident with the degree of vacuum of the process chamber P; for example, when the pressure of process chamber P is set at $10^{-5}$ Pa, even in case where the pressure of the decompression chamber R is set about $10^{-4}$ Pa (about 1/10 of the atmospheric pressure), the degree of deformation of the moving block 30 can be reduced down to about 1/10 of the degree of deformation that occurs in the structure excluding the decompression chamber R. Thanks to this, as the pump P3 of the decompression chamber R, there can be used a pump which is lower in capacity and lower in cost, which makes it possible to reduce the cost of the positioning apparatus. However, in case where there is formed in the moving block 30 a passage which allows the decompression chamber R and process chamber P to communicate with each other, there can be omitted the pump P3 for the decompression chamber R. In this case, not only the areas S1 but also the areas S2 must be coated with the CVD films. By the way, in the second embodiment, in case where as the mother material, instead of ceramic material, there is used metal material such as stainless steel or aluminum alloy, there can be obtained an effect that the gas molecules Am can be restricted from moving into the process chamber P. In this respect, the moving block 30 may also be formed of metal material.

Although description has been given heretofore of the present invention using the preferred embodiments thereof, the present invention is not limited to these embodiments but, of course, various changes and improvements are also possible. For example, the moving block 30 may also be structured such that it is able to move not only in the right and left direction in FIG. 1 but also in a direction perpendicular to the figure sheet (that is, it is able to move in a two-dimensional manner). Or, the moving block 30 can be made of a round shaft so that it can be moved in the axial direction thereof to move into and out of an opening formed in a box body. However, it makes little sense to apply the present invention to a structure in which the round shaft cannot be moved in the axial direction thereof but it can be only rotated.

In addition, in the first to seventh embodiments, the surface of the portion of the moving member, which is the moving block 30, 430, the round shaft 130, 230, 330 and so on, to be moved into at least the interior of the process chamber may be formed of high-density material or coated with the CVD firm or the PVD film as shown in the eighth embodiment. According to the above composition of the moving member, since either absorption or occlusion of the gas molecules or the like does not happened quite often, it can certainly prevent the gas molecules or the like from intruding into the process chamber P.

For example, in the third embodiment, with respect to the maximum stroke amount S of the round shaft 130, when the distance from the inner wall 120b of the process chamber P to the inner wall 151a of the peripheral groove 151 (or to the inner wall 152a of the peripheral groove 152) is expressed as a distance C (or d), the distance c (or d) is set in such a manner that the relationship S≦c (or S≦d) can hold. According to the above composition, the positioning apparatus can be applied to the process chamber with strict condition. However, in the case of the surface of the round shaft 130 to be moved into at least the interior of the process chamber is formed of high-density material or coated with the CVD firm or the PVD film, under the terms, if S≦b is hold as shown in the second embodiment, the positioning apparatus can be applied to the process chamber with strict condition shown in the same of the third embodiment.

As has been described heretofore, a positioning apparatus according to the present invention comprises a box body including not only a process chamber formed in the interior thereof but also an opening allowing the process chamber to communicate with the outside, a moving member disposed so as to shield at least part of the opening and movable with respect to the opening of the box body, and a differential pumping seal for sealing a clearance between the box body and moving member, in which, when the moving member moves, in order to prevent the portion of the moving member that is exposed to the outside of the box body from being moved into the interior of the process chamber, the width of the portion of the box body that is opposed to the moving member in the moving direction of the moving member is set equal to or larger than the moving amount of the moving member. Thanks to this, even in case where gas molecules are adsorbed to the surface of the moving member exposed to the exterior of the process chamber, since the present surface is prevented from moving into the interior of the process chamber, the environment of the interior of the process chamber can be protected.

In addition, since the above effect can be accomplished without using a particular material for the moving member, the present invention has an advantage of the production cost.

The researches made by the inventors have shown that, in case where the dry air (the air with the moisture component removed therefrom) is used as the environment to which the portion of the moving member movable into and out of the interior of the process chamber is exposed, the amount of gas to be released into the interior of the process chamber can be restricted as effectively as when the inert gas is used to provide such environment. Since the dry air can be obtained by removing the moisture from the air, when compared with creation of the inert gas environment, formation of the dry air environment can reduce the time and labor for management and cost thereof greatly.

As has been described heretofore, a positioning apparatus according to the first aspect of the present invention comprises a box body including not only a process chamber formed in the interior thereof so as to be exposed to a decompressed environment but also an opening for allowing the process chamber to communicate with the outside, a moving member formed of ceramic material such that it can shield at least part of the opening of the box body and it is able to move with respect to the opening of the box body, and a differential pumping seal for sealing the opening of the box body and moving member with respect to each other, while close-density material is disposed on the surface of the portion of the moving member that is allowed move between the interior and exterior of the process chamber. Since as the mother material of the moving member, there is used ceramic material which is light in weight (low in specific gravity) and is high in rigidity, the deformation amount of the moving member can be restricted and thus the positioning accuracy of the positioning apparatus can be enhanced. Also, because the ceramic material is non-magnetic material, especially when an ion charge apparatus or an electronic beam apparatus requiring a vacuum environment and low magnetic field variations is used in working a work in the interior of the process chamber, there can be provided a more suitable positioning apparatus. In addition to this, since the close-density material is disposed on the surface of at least the portion of the moving member movable between the interior and exterior of the process chamber, the adsorption of the gas molecules can be restricted to thereby be able to protect the environment of the interior of the process chamber.

Also, a positioning apparatus according to the second (or third) aspect of the present invention comprises a box body having not only a process chamber formed in the interior thereof so as to be exposed to a decompressed environment but also an opening for allowing the process chamber to communicate with the outside, a moving member formed of ceramic material (or metal material) such that it can shield at least part of the opening of the box body and it is able to move with respect to the opening of the box body, and a differential pumping seal for sealing the opening of the box body and moving member with respect to each other, while a close-density coating is disposed on the surface of the portion of the moving member that is allowed to move between the interior and exterior of the process chamber. Therefore, in case where, as the mother material of the moving member, there is used ceramic material which is light in weight (low in specific gravity) and is high in rigidity, the deformation amount of the moving member can be restricted and thus the positioning accuracy of the positioning apparatus can be enhanced. Also, since the ceramic material is non-magnetic material, especially when an ion charge apparatus or an electronic beam apparatus requiring a vacuum environment and low magnetic field variations is used in working a work in the interior of the process chamber, according to the present aspect of the present invention, there can be provided a positioning apparatus which is further suitable for this purpose. In addition to this, because the close-density coating is disposed on the surface of the portion of the moving member that is allowed to move between the interior and exterior of the process chamber, the adsorption and elimination of the gas molecules can be restricted to thereby be able to protect the environment of the interior of the process chamber.

What is claimed is:

1. A positioning apparatus comprising:
   a box body including a process chamber exposed to a decompression environment in the interior of the box body and an opening allowing said process chamber to communicate with an area outside of the box body;
   a moving member for shielding said opening of said box body with a slight clearance between said box body and the moving member and movable with respect to said opening of said box body;
   a differential pumping seal for sealing said slight clearance between said opening of said box body and said moving member, wherein a portion of said moving member to be moved into the interior of said process chamber, when said moving member moves, is formed as an adsorption preventive area;

cover member for covering at least the portion of said moving member movable between an interior side and an exterior side of said process chamber on said process chamber exterior side; and an air supply device for supplying a dry air having lower humidity than the atmosphere of said process chamber exterior side into said cover member.

2. The positioning apparatus as set forth in claim 1, wherein said dry air, when the atmosphere of said process chamber exterior side contains the air having the humidity of 50%, is the air having such humidity that can control variations in the pressure of the interior of said process chamber caused by the movement of said moving member down to 30% or less.

3. The positioning apparatus as set forth in claim 1, wherein said dry air is the air having the humidity of 10% or less.

4. The positioning apparatus as set forth in claim 2, wherein said dry air is the air having the humidity of 10% or less.

5. The positioning apparatus as set forth in claim 1, wherein said cover member is a hydrostatic bearing for guiding said moving member.

6. The positioning apparatus as set forth in claim 2, wherein said cover member is a hydrostatic bearing for guiding said moving member.

7. The positioning apparatus as set forth in claim 3, wherein said cover member is a hydrostatic bearing for guiding said moving member.

8. The positioning apparatus as set forth in claim 4, wherein said cover member is a hydrostatic bearing for guiding said moving member.

9. The positioning apparatus as set forth in claim 1, wherein said adsorption preventive area is formed such that at least the surface thereof is formed of high-density material or is coated with a CVD film or a PVD film.

* * * * *